US009028612B2

(12) United States Patent
Bondokov et al.

(10) Patent No.: US 9,028,612 B2
(45) Date of Patent: May 12, 2015

(54) GROWTH OF LARGE ALUMINUM NITRIDE SINGLE CRYSTALS WITH THERMAL-GRADIENT CONTROL

(75) Inventors: Robert T. Bondokov, Watervliet, NY (US); Shailaja P. Rao, Albany, NY (US); Shawn Robert Gibb, Clifton Park, NY (US); Leo J. Schowalter, Latham, NY (US)

(73) Assignee: Crystal IS, Inc., Green Island, NY (US)

( * ) Notice: Subject to any disclaimer, the term of this patent is extended or adjusted under 35 U.S.C. 154(b) by 904 days.

(21) Appl. No.: 13/173,213

(22) Filed: Jun. 30, 2011

(65) Prior Publication Data

US 2012/0000414 A1    Jan. 5, 2012

Related U.S. Application Data

(60) Provisional application No. 61/360,142, filed on Jun. 30, 2010.

(51) Int. Cl.
| | | |
|---|---|---|
| *C30B 23/00* | (2006.01) | |
| *C30B 23/02* | (2006.01) | |
| *C30B 23/06* | (2006.01) | |
| *C30B 29/40* | (2006.01) | |

(52) U.S. Cl.
CPC ............. *C30B 23/002* (2013.01); *C30B 29/403* (2013.01)

(58) Field of Classification Search
CPC ........ C30B 23/00; C30B 23/02; C30B 23/06; C30B 23/063; C30B 23/066; C30B 29/403
USPC .............................. 117/84, 88, 101, 937, 952
See application file for complete search history.

(56) References Cited

U.S. PATENT DOCUMENTS

| | | |
|---|---|---|
| 3,531,245 A | 9/1970 | Dietz |
| 3,600,701 A | 8/1971 | Gouldthorpe |
| 3,603,414 A | 9/1971 | Stebley |
| 3,607,014 A | 9/1971 | Huml et al. |
| 3,634,149 A | 1/1972 | Knippenberg et al. |
| 3,768,983 A | 10/1973 | Elkins et al. |
| 3,903,357 A | 9/1975 | Woolfson et al. |
| 3,933,573 A | 1/1976 | Dugger |
| 4,008,851 A | 2/1977 | Hirsch |
| 4,088,515 A | 5/1978 | Blakeslee et al. |

(Continued)

FOREIGN PATENT DOCUMENTS

| | | |
|---|---|---|
| CN | 2492947 | 5/2002 |
| CN | 201274297 Y | 7/2009 |

(Continued)

OTHER PUBLICATIONS

Office Action in Chinese Patent Application No. 200680045153.1, Oct. 13, 2010, 4 pages (translation).

(Continued)

*Primary Examiner* — Kenneth A Bratland, Jr.
(74) *Attorney, Agent, or Firm* — Morgan, Lewis & Bockius LLP

(57) ABSTRACT

In various embodiments, non-zero thermal gradients are formed within a growth chamber both substantially parallel and substantially perpendicular to the growth direction during formation of semiconductor crystals, where the ratio of the two thermal gradients (parallel to perpendicular) is less than 10, by, e.g., arrangement of thermal shields outside of the growth chamber.

24 Claims, 4 Drawing Sheets

(56) References Cited

U.S. PATENT DOCUMENTS

| | | |
|---|---|---|
| 4,234,554 A | 11/1980 | Rabenau et al. |
| 4,547,471 A | 10/1985 | Huseby et al. |
| 5,057,287 A | 10/1991 | Swiggard |
| 5,070,393 A | 12/1991 | Nakagawa et al. |
| 5,087,949 A | 2/1992 | Haitz |
| 5,292,487 A | 3/1994 | Tatsumi et al. |
| 5,312,698 A | 5/1994 | Sato et al. |
| 5,494,861 A | 2/1996 | Yamaga et al. |
| 5,520,785 A | 5/1996 | Evans et al. |
| 5,525,320 A | 6/1996 | Pratsinis et al. |
| 5,571,603 A | 11/1996 | Utumi et al. |
| 5,670,798 A | 9/1997 | Schetzina |
| 5,703,397 A | 12/1997 | Endo et al. |
| 5,728,635 A | 3/1998 | Kobayashi et al. |
| 5,858,085 A | 1/1999 | Arai et al. |
| 5,858,086 A | 1/1999 | Hunter |
| 5,868,837 A | 2/1999 | DiSalvo et al. |
| 5,909,036 A | 6/1999 | Tanaka et al. |
| 5,924,874 A | 7/1999 | Gotoh et al. |
| 5,954,874 A | 9/1999 | Hunter |
| 5,972,109 A | 10/1999 | Hunter |
| 5,981,980 A | 11/1999 | Miyajima et al. |
| 6,000,174 A | 12/1999 | Yamazaki et al. |
| 6,001,748 A | 12/1999 | Tanaka et al. |
| 6,006,620 A | 12/1999 | Lawrie et al. |
| 6,045,612 A | 4/2000 | Hunter |
| 6,048,813 A | 4/2000 | Hunter |
| 6,063,185 A | 5/2000 | Hunter |
| 6,066,205 A | 5/2000 | Hunter |
| 6,086,672 A | 7/2000 | Hunter |
| 6,091,085 A | 7/2000 | Lester |
| 6,187,089 B1 | 2/2001 | Phillips et al. |
| 6,211,089 B1 | 4/2001 | Kim et al. |
| 6,270,569 B1 | 8/2001 | Shibata et al. |
| 6,296,956 B1 | 10/2001 | Hunter |
| 6,398,867 B1 | 6/2002 | D'Evelyn et al. |
| 6,404,125 B1 | 6/2002 | Garbuzov et al. |
| 6,447,604 B1 | 9/2002 | Flynn et al. |
| 6,468,347 B1 | 10/2002 | Motoki et al. |
| 6,515,308 B1 | 2/2003 | Kneissl et al. |
| 6,533,874 B1 | 3/2003 | Vaudo et al. |
| 6,548,405 B2 | 4/2003 | Kraus et al. |
| 6,592,663 B1 | 7/2003 | Sarayama et al. |
| 6,596,079 B1 | 7/2003 | Vaudo et al. |
| 6,719,843 B2 | 4/2004 | Schowalter et al. |
| 6,770,135 B2 | 8/2004 | Schowalter et al. |
| 6,777,717 B1 | 8/2004 | Karlicek |
| 6,791,119 B2 | 9/2004 | Slater, Jr. et al. |
| 6,800,876 B2 | 10/2004 | Edmond et al. |
| 6,831,302 B2 | 12/2004 | Erchak et al. |
| 6,840,431 B1 | 1/2005 | Kim |
| 6,861,729 B2 | 3/2005 | Kozaki et al. |
| 6,891,268 B2 | 5/2005 | Tomiya et al. |
| 6,921,929 B2 | 7/2005 | LeBoeuf et al. |
| 6,936,357 B2 | 8/2005 | Melnik et al. |
| 6,940,075 B2 | 9/2005 | Schulz |
| 6,995,402 B2 | 2/2006 | Ludowise et al. |
| 7,026,659 B2 | 4/2006 | Slater, Jr. et al. |
| 7,037,738 B2 | 5/2006 | Sugiyama et al. |
| 7,037,838 B2 | 5/2006 | Schowalter et al. |
| 7,056,383 B2 | 6/2006 | Helava et al. |
| 7,063,741 B2 | 6/2006 | D'Evelyn et al. |
| 7,087,112 B1 | 8/2006 | Rojo et al. |
| 7,095,054 B2 | 8/2006 | Fjelstad |
| 7,125,734 B2 | 10/2006 | Sackrison et al. |
| 7,186,580 B2 | 3/2007 | Tran et al. |
| 7,211,146 B2 | 5/2007 | Schowalter |
| 7,211,831 B2 | 5/2007 | Erchak et al. |
| 7,244,520 B2 | 7/2007 | Kumakura et al. |
| 7,250,637 B2 | 7/2007 | Shimizu et al. |
| 7,274,043 B2 | 9/2007 | Erchak et al. |
| 7,276,779 B2 | 10/2007 | Shibata |
| 7,288,152 B2 | 10/2007 | Kitaoka et al. |
| 7,420,218 B2 | 9/2008 | Nagai |
| 7,420,222 B2 | 9/2008 | Slater, Jr. et al. |
| 7,439,552 B2 | 10/2008 | Takigawa et al. |
| 7,476,910 B2 | 1/2009 | Fujimoto et al. |
| 7,518,158 B2 | 4/2009 | Keller et al. |
| 7,524,376 B2 | 4/2009 | Wang |
| 7,554,128 B2 | 6/2009 | Okamoto et al. |
| 7,631,986 B2 | 12/2009 | Harrah |
| 7,638,346 B2 | 12/2009 | Schowalter et al. |
| 7,641,735 B2 | 1/2010 | Slack et al. |
| 7,674,699 B2 | 3/2010 | Shibata |
| 7,678,195 B2 | 3/2010 | Schlesser et al. |
| 7,713,844 B2 | 5/2010 | Nishiura et al. |
| 7,750,355 B2 | 7/2010 | Dwilinski et al. |
| 7,755,103 B2 | 7/2010 | Ueno |
| 7,776,153 B2 | 8/2010 | Schowalter et al. |
| 7,803,733 B2 | 9/2010 | Teratani et al. |
| 7,902,566 B2 | 3/2011 | Paolini et al. |
| 7,943,952 B2 | 5/2011 | Loh et al. |
| 7,956,372 B2 | 6/2011 | Kamada et al. |
| 7,976,186 B2 | 7/2011 | Loh |
| 8,012,257 B2 | 9/2011 | Morgan et al. |
| 8,080,833 B2 | 12/2011 | Grandusky et al. |
| 8,088,220 B2 | 1/2012 | Slack et al. |
| 8,123,859 B2 | 2/2012 | Schowalter et al. |
| 8,222,650 B2 | 7/2012 | Schowalter et al. |
| 8,323,406 B2 | 12/2012 | Bondokov et al. |
| 8,349,077 B2 | 1/2013 | Bondokov et al. |
| 8,545,629 B2 | 10/2013 | Schowalter et al. |
| 8,580,035 B2 | 11/2013 | Bondokov et al. |
| 8,747,552 B2 | 6/2014 | Slack et al. |
| 8,834,630 B2 | 9/2014 | Bondokov et al. |
| 8,896,020 B2 | 11/2014 | Schowalter et al. |
| 2001/0000209 A1 | 4/2001 | Krames et al. |
| 2001/0005023 A1 | 6/2001 | Itoh et al. |
| 2001/0024871 A1 | 9/2001 | Yagi |
| 2001/0051433 A1 | 12/2001 | Francis et al. |
| 2002/0030194 A1 | 3/2002 | Camras et al. |
| 2002/0170490 A1 | 11/2002 | Vodakov et al. |
| 2003/0047816 A1 | 3/2003 | Dutta |
| 2003/0160254 A1 | 8/2003 | Henrichs |
| 2003/0168003 A1 | 9/2003 | Schowalter et al. |
| 2003/0213964 A1 | 11/2003 | Flynn |
| 2003/0216011 A1 | 11/2003 | Nakamura et al. |
| 2004/0033690 A1 | 2/2004 | Schowalter et al. |
| 2004/0104442 A1 | 6/2004 | Feudel et al. |
| 2004/0130002 A1 | 7/2004 | Weeks et al. |
| 2004/0187766 A1 | 9/2004 | Letertre |
| 2004/0206978 A1 | 10/2004 | Saxler |
| 2004/0213309 A9 | 10/2004 | Amano et al. |
| 2004/0224484 A1 | 11/2004 | Fareed et al. |
| 2004/0226917 A1 | 11/2004 | Laconto et al. |
| 2004/0245535 A1 | 12/2004 | D'Evelyn et al. |
| 2004/0251471 A1 | 12/2004 | Dwilinski et al. |
| 2005/0062392 A1 | 3/2005 | Sakai et al. |
| 2005/0072986 A1 | 4/2005 | Sasaoka |
| 2005/0103257 A1 | 5/2005 | Xu et al. |
| 2005/0142391 A1 | 6/2005 | Dmitriev et al. |
| 2005/0161697 A1 | 7/2005 | Nakahata et al. |
| 2005/0164044 A1 | 7/2005 | Melnik et al. |
| 2005/0214992 A1 | 9/2005 | Chakraborty et al. |
| 2005/0269577 A1 | 12/2005 | Ueda et al. |
| 2005/0277214 A1 | 12/2005 | Uematsu et al. |
| 2005/0285141 A1 | 12/2005 | Piner et al. |
| 2006/0005763 A1 | 1/2006 | Schowalter et al. |
| 2006/0029832 A1 | 2/2006 | Xu et al. |
| 2006/0054075 A1 | 3/2006 | Dwilinski et al. |
| 2006/0181695 A1 | 8/2006 | Sage, Jr. |
| 2006/0244011 A1 | 11/2006 | Saxler |
| 2006/0255341 A1 | 11/2006 | Pinnington et al. |
| 2006/0281205 A1 | 12/2006 | Park |
| 2006/0288929 A1 | 12/2006 | Slack et al. |
| 2007/0018184 A1 | 1/2007 | Beeson et al. |
| 2007/0082019 A1 | 4/2007 | Huang et al. |
| 2007/0101932 A1 | 5/2007 | Schowalter et al. |
| 2007/0102721 A1 | 5/2007 | Denbaars et al. |
| 2007/0131160 A1 | 6/2007 | Slack et al. |
| 2007/0134827 A1 | 6/2007 | Bondokov et al. |
| 2007/0151905 A1 | 7/2007 | Wang et al. |
| 2007/0224714 A1 | 9/2007 | Ikeda et al. |
| 2007/0243653 A1 | 10/2007 | Morgan et al. |

(56) References Cited

U.S. PATENT DOCUMENTS

| | | |
|---|---|---|
| 2007/0257333 A1 | 11/2007 | Schlesser et al. |
| 2008/0006200 A1* | 1/2008 | Schowalter et al. ............ 117/89 |
| 2008/0012034 A1 | 1/2008 | Thielen et al. |
| 2008/0023719 A1 | 1/2008 | Camras et al. |
| 2008/0036038 A1 | 2/2008 | Hersee et al. |
| 2008/0054280 A1 | 3/2008 | Reginelli et al. |
| 2008/0087984 A1 | 4/2008 | Melas |
| 2008/0121910 A1 | 5/2008 | Bergmann et al. |
| 2008/0135861 A1 | 6/2008 | Pokrovskiy et al. |
| 2008/0142817 A1 | 6/2008 | Ibbetson et al. |
| 2008/0144688 A1 | 6/2008 | Chua et al. |
| 2008/0149945 A1 | 6/2008 | Nagai |
| 2008/0149960 A1 | 6/2008 | Amo et al. |
| 2008/0157111 A1 | 7/2008 | Erchak et al. |
| 2008/0173887 A1 | 7/2008 | Baba et al. |
| 2008/0182092 A1* | 7/2008 | Bondokov et al. ............ 428/220 |
| 2008/0187016 A1 | 8/2008 | Schowalter et al. |
| 2008/0191225 A1 | 8/2008 | Medendorp |
| 2008/0246047 A1 | 10/2008 | Hsu et al. |
| 2008/0251808 A1 | 10/2008 | Kususe et al. |
| 2008/0258165 A1 | 10/2008 | Zimmerman |
| 2009/0008654 A1 | 1/2009 | Nagai |
| 2009/0014742 A1 | 1/2009 | Erchak |
| 2009/0039373 A1 | 2/2009 | Saito et al. |
| 2009/0050050 A1 | 2/2009 | Slack et al. |
| 2009/0065791 A1 | 3/2009 | Yen et al. |
| 2009/0065792 A1 | 3/2009 | Thompson et al. |
| 2009/0078957 A1 | 3/2009 | Hoshina |
| 2009/0121246 A1 | 5/2009 | Denbaars et al. |
| 2009/0121250 A1 | 5/2009 | Denbaars et al. |
| 2009/0140279 A1 | 6/2009 | Zimmerman et al. |
| 2009/0141502 A1 | 6/2009 | Sonoda et al. |
| 2009/0155969 A1 | 6/2009 | Chakravarti et al. |
| 2009/0155989 A1 | 6/2009 | Uematsu et al. |
| 2009/0159910 A1 | 6/2009 | Lin et al. |
| 2009/0166657 A1 | 7/2009 | Yamada et al. |
| 2009/0173958 A1 | 7/2009 | Chakraborty et al. |
| 2009/0233394 A1 | 9/2009 | Batres et al. |
| 2009/0239357 A1 | 9/2009 | Amano et al. |
| 2009/0256163 A1 | 10/2009 | Chakraborty |
| 2009/0261372 A1 | 10/2009 | Ueda |
| 2009/0267098 A1 | 10/2009 | Choi |
| 2009/0278148 A1 | 11/2009 | Nabekura et al. |
| 2009/0283028 A1 | 11/2009 | Schowalter et al. |
| 2009/0315054 A1 | 12/2009 | Kim et al. |
| 2009/0321758 A1 | 12/2009 | Liu et al. |
| 2009/0321771 A1 | 12/2009 | Hattori et al. |
| 2010/0006870 A1 | 1/2010 | Lee et al. |
| 2010/0012956 A1 | 1/2010 | Yoo et al. |
| 2010/0025717 A1 | 2/2010 | Fujii et al. |
| 2010/0025719 A1 | 2/2010 | Li |
| 2010/0135349 A1 | 6/2010 | Schowalter et al. |
| 2010/0187541 A1 | 7/2010 | Slack et al. |
| 2010/0264460 A1 | 10/2010 | Grandusky et al. |
| 2010/0314551 A1 | 12/2010 | Bettles et al. |
| 2011/0008621 A1 | 1/2011 | Schujman et al. |
| 2011/0008923 A1 | 1/2011 | Lin et al. |
| 2011/0011332 A1 | 1/2011 | Schowalter et al. |
| 2012/0021175 A1 | 1/2012 | Moody et al. |
| 2012/0104355 A1 | 5/2012 | Grandusky et al. |
| 2013/0152852 A1 | 6/2013 | Bondokov et al. |
| 2013/0157442 A1 | 6/2013 | Bondokov et al. |
| 2014/0061666 A1 | 3/2014 | Schowalter et al. |
| 2014/0093671 A1 | 4/2014 | Bondokov et al. |
| 2014/0203311 A1 | 7/2014 | Schowalter et al. |
| 2014/0231725 A1 | 8/2014 | Slack et al. |
| 2014/0264263 A1 | 9/2014 | Grandusky et al. |

FOREIGN PATENT DOCUMENTS

| | | |
|---|---|---|
| DE | 102 48 964 | 4/2004 |
| EP | 0609799 A2 | 8/1994 |
| EP | 0811708 A2 | 12/1997 |
| EP | 0979883 A1 | 2/2000 |
| EP | 1211715 A2 | 6/2002 |
| EP | 1544925 A2 | 6/2005 |
| EP | 1 732 145 | 12/2006 |
| EP | 1754810 A1 | 2/2007 |
| EP | 1852528 | 11/2007 |
| EP | 2099068 A1 | 9/2009 |
| EP | 2287367 | 2/2011 |
| JP | 61-236686 A | 10/1986 |
| JP | 2-18379 A | 1/1990 |
| JP | 3-285075 A | 12/1991 |
| JP | 9-83016 A | 3/1997 |
| JP | 2000-31059 A | 1/2000 |
| JP | 2000-154090 A | 6/2000 |
| JP | 01/192647 | 7/2001 |
| JP | 2002-274996 A | 9/2002 |
| JP | 2003-197541 A | 7/2003 |
| JP | 2004-355920 A | 12/2004 |
| JP | 2005-167275 A | 6/2005 |
| JP | 2005-210084 A | 8/2005 |
| JP | 2005-536873 A | 12/2005 |
| JP | 2006-511432 A | 4/2006 |
| JP | 2006-169173 A | 6/2006 |
| JP | 2006-319107 A | 11/2006 |
| JP | 06/335608 | 12/2006 |
| JP | 2011-060986 A | 3/2011 |
| WO | WO-99/34037 | 7/1999 |
| WO | 00/22203 A2 | 4/2000 |
| WO | 01/11116 A1 | 2/2001 |
| WO | 03/007383 A2 | 1/2003 |
| WO | 03/081730 A2 | 10/2003 |
| WO | 2004/061896 A2 | 7/2004 |
| WO | WO-2005/012602 | 2/2005 |
| WO | 2006/110512 A1 | 10/2006 |
| WO | 2007/062250 A2 | 5/2007 |
| WO | WO-2007/113537 | 10/2007 |
| WO | 2008/042020 A2 | 4/2008 |
| WO | WO-2008/088838 | 7/2008 |
| WO | 2012/012010 A2 | 1/2012 |
| WO | 2014/151264 A1 | 9/2014 |

OTHER PUBLICATIONS

Office Action in Chinese Patent Application No. 200780018103.9, Apr. 6, 2011, 6 pages (translation).

Epelbaum et al., "Natural Growth Habit of Bulk AlN Crystals," Journal of Crystal Growth, vol. 265, No. 3-4, pp. 577-581 (May 2004).

Bennett et al., "High Quality InGaAs/InP and InAlAs/InP Heterostructures Beyond the Matthew-Blakeslee Critical Layer Thickness," 4th Annual conference on InP and Related Materials, Newport, RI, pp. 650-653 (Apr. 1992).

International Search Report and Written Opinion mailed Sep. 19, 2011 for International Application No. PCT/US2011/042571 (14 pages).

Arulkumaran et al., "Improved dc characteristics of AlGaN/GaN high-electron-mobility transistors on AlN/sapphire templates," (2002) *Applied Physics Letters* vol. 81, No. 6, pp. 1131-1133.

Cox et al., "On the Preparation, Optical Properties and Electrical Behaviour of Aluminum Nitride," *J. Phys. Chem. Solids*, (1967) vol. 28, pp. 543-548.

Honig, "Vapor Pressure Data for the Solid and Liquid Elements", *RCA Review*, vol. 23 (1962).

Jahnen et al., "Pinholes, Dislocations and Strain Relaxation in InGaN," *MRS Internet J. Nitride Semicond. Res.*, (1998) 3:39.

Liu et al., "Characterization of AlN Crystals Grown by Sublimation," *Phys. Stat. Sol.* (a), (2001) 188, p. 769.

Noveski et al., "Growth of AlN Crystals on AlN/SiC Seeds by AlN Powder Sublimation in Nitrogen Atmosphere," *MRS Internet J. Nitride Semicond. Res.*, (2004) 9, 2.

Schlesser et al., "Growth of AlN Bulk Crystals from the Vapor Phase," *Mat. Res. Soc. Symp. Proc.*, (2002) 693, p. I9.4.1.

Slack et al., "Some Effects of Oxygen Impurities on AlN and GaN," *J. Crystal Growth*, (2002) 246, pp. 287-298.

Van de Walle et al., "DX-center Formation in Wurtzite and Zinc-blende $Al_xGa1-xN$," *Phys. Rev.*, (1998) B57, R2033.

(56) References Cited

OTHER PUBLICATIONS

Berzina-RadEFF 157, 1089, 2002—Luminescence mechanisms of O-related defects in AlN.
Evans-APL 88, 06112, 2006—EPR of a donor in AlN crystals.
Klemens-PhysB, 316-317,413, 2002—Effect of point defects on the decay of the longitudinal optical mode.
Nepal—APL 89, 092107, 2006—Photoluminescene studies of impurity transitions in AlGaN alloys.
Stampfl-PRB 65, 155212, 2002-Theoretical investigation of native defects, impurities and complexes in aluminum nitride.
Katayama-Yoshida et al., "Codoping method for the Fabrication of Low-Resistivity Wide Band-Gap Semiconductors in p-type GaN, p-type AlN and n-type Diamond: Prediction versus Experiment," 13 J. of Physics: Condensed Matter, pp. 8901-8914 (2001).
Gaska et al., "Deep-Ultraviolet Emission of AlGaN/AlN Quantum Wells on Bulk AlN," Applied Physics Letters, vol. 81, No. 24, pp. 4658-4660 (Dec. 9, 2002).
"Multi-Year Program Plan FY'08-FY'13: Solid State Lighting Research and Development", Lighting Research and Development Building Technologies Program, U.S. Deptartment of Energy, Mar. 2007, 144 pages.
Ali et al., "Enhancement of Near-UV GaN LED Light Extraction Efficiency by GaN/Sapphire Template Patterning", Semiconductor Science and Technology, vol. 27, 2012, pp. 1-5.
Atobe et al., "F-Type Centers in Neutron-Irradiated AlN", Japanese Journal of Applied Physics, vol. 29, No. 1, Jan. 1990, pp. 150-152.
Balkas et al., "Sublimation Growth and Characterizations of Bulk Aluminum Nitride Single Crystals", Journal of Crystal Growth, vol. 179, 1997, pp. 363-370.
Ban et al., "Ir/Ag Reflector for High-Performance GaN-Based Near UV Light Emitting Diodes", Materials Science and Engineering B, vol. 133, 2006, pp. 26-29.
Barin, Ihsan, "Thermochemical Data of Pure Substances", Second Edition, VCH, 1993, 13 pages.
Bickerman et al., "Polarization Dependent Below Band-Gap Optical Absorption of Aluminium Nitride Bulk Crystals", Journal of Applied Physics, vol. 103, 2008, pp. 073522-1-073522-3.
Bickerman et al., "PVT Growth of Bulk AlN Crystals with Low Oxygen Contamination", Physica Status Solidi (C), No. 7, Dec. 2003, pp. 1993-1996.
Bickermann et al., "Characterization of Bulk AlN with Low Oxygen Content", Journal of Crystal Growth, vol. 269, 2004, pp. 432-442.
Bickermann et al., "Point Defect Content and Optical Transitions in Bulk Aluminum Nitride Crystals", Physica Status Solidi (B), vol. 246, No. 6, 2009, pp. 1181-1183.
Bockowski et al., "Combustion Synthesis of Aluminum Nitride Under High Pressure of Nitrogen and Nitrogen-Argon Mixtures", Journal of Material Synthesis & Processing, vol. 5, No. 6, 1997, pp. 449-458.
Bolgar et al., "Vaporization of the Nitirides of B, Al, and Ga", Khim Fiz. Nitrodov Chem. Abstr. 71, 34003j, 1968, pp. 151-156 (English Abstract Included).
Bradley et al., "Deep Level Defects and Doping in High Al mole Fraction AlGaN", Journal of Vacuum Science & Technology B, vol. 21, No. 6, 2003, pp. 12558-2563.
Brunner et al., "Optical Constants of Epitaxial AlGaN Films and Their Temperature Dependence", Journal of Applied Physics, vol. 82, No. 10, Nov. 15, 1997, pp. 5090-5096.
Chase, Jr., Malcolm W., "NIST-JANAF Thermochemical Tables, Fourth Edition, Part I, Al-Co", J. Phys. Chem., Ref. Data, Monograph No. 9, 1998, 8 pages.
Cheng et al., "Light Output Enhancement of UV Light-Emitting Diodes with Embedded Distributed Bragg Reflector", IEEE Photonics Technology Letters, vol. 23, No. 10, May 15, 2011, pp. 642-644.
Cheong et al., "Structural and Optical Properties of Near-UV LEDs Grown on V-Grooved Sapphire Substrates Fabricated by Wet Etching", Journal of Crystal Growth, vol. 298, 2007, pp. 699-702.
Chitnis et al., "Milliwatt Power AlGaN Quantum Well Deep Ultraviolet Light Emitting Diodes", Phys. Stat. Sol. (a), vol. 200, No. 1, 2003, pp. 99-101.

Chiu et al., "Efficiency Enhancement of UV/blue Light Emitting Diodes Via Nanoscaled Epitaxial Lateral Overgrowth of GaN on a SiO2 Nanorod-Array Patterned Sapphire Substrate", Journal of Crystal Growth, vol. 310, 2008, pp. 5170-5174.
Collins et al., "Lattice Vibration Spectra of Aluminum Nitride", Physical Review, vol. 158, No. 3, Jun. 15, 1967, pp. 833-838.
Constantin et al., "Mixing Rocksalt and Wurtzite Structure Binary Nitrides to form Novel Ternary Alloys: ScGaN and MnGaN", Mat. Res. Soc. Symp. Proc., vol. 799, 2004, pp. Z9.5.1-Z9.5.6.
Dalmau et al., "Crucible Selection in AlN Bulk Crystal Growth", Mat. Res. Soc. Symp. Proc., vol. 798, 2004, pp. Y2.9.1-Y2.9.5.
Devries et al., "Phase Equilibria Pertinent to the Growth of Cubic Boron Nitride", Journal of Crystal Growth, vol. 13/14, 1972, pp. 88-92.
Dong et al., "Ultraviolet Electroluminescence from Ordered ZnO Nanorod Array/p-GaN Light Emitting Diodes", Applied Physics Letters, vol. 100, 2012, pp. 171109-1-171109-4.
Dryburgh, P. M., "The Estimation of Maximum Growth Rate for Aluminum Nitride Crystals Grown by Direct Sublimation", Journal of Crystal Growth, vol. 125, 1992, pp. 65-68.
Dugger, Cortland O., "The Single Crystal Synthesis and Some Properties of Aluminum Nitride", Physical Science Research Papers, No. 656, Aug. 1, 1975, 67 pages.
Dugger, Cortland O., "The Synthesis of Aluminum Nitride Single Crystals", Mat. Res. Bull.,vol. 9, 1974, pp. 331-336.
Edgar et al., "Native Oxide and Hydroxides and Their Implications for Bulk AlN Crystal Growth", 2008, pp. 1-15.
Epelbaum et al., "Sublimation Growth of Bulk AlN Crystals: Materials Compatibility and Crystal Quality", Mat. Sci. Forum, vols. 389-393, 2002, pp. 1445-1448.
Freitas et al., "Properties of Bulk AlN Grown by Thermodecomposition of AlCl3.NH3", Applied Physics Letters, vol. 83, No. 13, Sep. 29, 2003, pp. 2584-2586.
Freitas et al., "Shallow Donors in GaN", Physica Status Solidi (B), vol. 240, No. 2, 2003, pp. 330-336.
Freitas, James A., "Optical Studies of Bulk and Homoepitaxial Films of III-V Nitride Semiconductors", Journal of Crystal Growth, vol. 281, 2005, pp. 168-182.
Gauckler et al., "Representation of Multicomponent Silicon Nitride Based Systems", Proceedings of NATO Advanced Study Institute on Nitrogen Ceramics, 1977, 4 pages.
Gorbatov et al., "Electrical Conductivity of Materials from Mixed Aluminum and Silicon Nitrides", Soviet Powder Metallurgy and Metal Ceramics, vol. 9, 1970, pp. 917-920.
Gutierrez et al., "The Formation of Nanopipes Caused by Donor Impurities in GaN: A Theoretical Study for the Case of Oxygen", Philosophical Magazine Letters, vol. 79, No. 3, 1999, pp. 147-152.
Gutt et al., "AlGaN-Based 355 nm UV Light-Emitting Diodes with High Power Efficiency", Applied Physics Express, vol. 5, 2012, p. 032101 (3 pages).
Hacke et al., "Photoluminescence Intensity and Spectral Distribution of GaN Films on SiC Substrates—The Dependence on Dislocation Density and Structure", Phys. Stat. Sol. (b), vol. 216, 1999, pp. 639-644.
Honda et al.,"Electron Paramagnetic Center in Neutron-Irradiated AlN", Japanese Journal of Applied Physics, vol. 29, No. 4, Apr. 1990., pp. L652-L654.
Hong et al., "Enhanced Light Output of GaN-Based Near-UV Light Emitting Diodes by Using Nanopatterned Indium Tin Oxide electrodes", Semiconductor Science and Technology, vol. 21, 2006, pp. 594-597.
Hong et al., "Fabrication of Moth-Eye Structure on p-GaN Layer of GaN-Based LEDs for Improvement of Light Extraction", Materials Science and Engineering B, vol. 163, 2009, pp. 170-173.
Hossain et al., "Study of Cathodoluminescence Spectroscopy of Aluminum Nitride", SPIE, vol. 2877, 1996, pp. 42-45.
Hsu et al., "Optimizing Textured Structures Possessing Both Optical Gradient and Diffraction Properties to Increase the Extraction Efficiency of Light-Emitting Diodes", Photonics and Nanostructures—Fundamentals and Applications, 2012, pp. 1-11.
Inazu et al., "Improvement of Light Extraction Efficiency for AlGaN-Based Deep Ultraviolet Light-Emitting Diodes", Japanese Journal of Applied Physics, vol. 50, 2011, p. 122101 (3 pages).

(56) References Cited

OTHER PUBLICATIONS

Iwaya et al., "Improvement of Light Extraction Efficiency of UV-LED Grown on Low-Dislocation-Density AlGaN", Phys. Stat. Sol. (a), vol. 200, No. 1, 2003, pp. 110-113.
Jeong et al., "InGaN/AlGaN Ultraviolet Light-Emitting Diode with a Ti3O5/Al2O3 Distributed Bragg Reflector", Japanese Journal of Applied Physics, vol. 47, No. 12, 2008, pp. 8811-8814.
Jones et al., "Optical Properties of AlN Determined by Vacuum Ultraviolet Spectroscopy and Spectroscopic Ellipsometry Data", Journal of Materials Research, vol. 14, No. 11, 1999, pp. 4337-4344.
Kanechika et al., "n-type AlN Layer by Si Ion Implantation", Applied Physics Letters, vol. 88, 2006, pp. 202106-1-202106-2.
Karel et al., "The Luminescence Properties of AlN with Manganese and Rare Earth Activators Under Ultraviolet and Cathode-Ray Excitation", Czechoslovak Journal of Physics B., vol. 20, 1970, pp. 46-55.
Karpinski et al., "Equilibrium Pressure of N2 Over GaN and High Pressure Solution Growth of GaN", Journal of Crystal Growth, vol. 66, 1984, pp. 1-10.
Karpov et al., "Sublimation Growth of AlN in Vacuum and in a Gas Atmosphere", Phys. Stat. Sol. (a), vol. 176, 1999, pp. 435-438.
Kasu et al., "Formation of Solid Solution of Al1-xSixN (O<x≤12%) Ternary Alloy", Jpn. J. Appl. Phys., vol. 40, Part 2, No. 10A, 2001, pp. L1048-L1050.
Kasugai et al., "High-Efficiency Nitride-Based Light-Emitting Diodes with Moth-Eye Structure", Japanese Journal of Applied Physics, vol. 44, No. 10, 2005, pp. 7414-7417.
Kawabe et al., "Electrical and Optical Properties of AlN-a Thermostable Semiconductor", Elec. Engin. in Japan, vol. 87, 1967, pp. 62-70.
Kazan et al., "Oxygen Behavior in Aluminum Nitride", Journal of Applied Physics, vol. 98, 2005, pp. 103529-1-103529-4.
Kazan et al., "Phonon Dynamics in AlN Lattice Contaminated by Oxygen", Diamond & Related Materials, vol. 15, 2006, pp. 1525-1534.
Kim et al., "Enhancement of Light Extraction Efficiency of Ultraviolet Light Emitting Diodes by Patterning of Sio2 Nanosphere Arrays", Thin Solid Films, vol. 517, 2009, pp. 2742-2744.
Kordis, J., "The BeO-MgO System", Journal of Nuclear Materials, vol. 14, 1964, pp. 322-325.
Kovalenkov et al., "Thick AlN Layers Grown by HVPE", Journal of Crystal Growth, vol. 281, 2005, pp. 87-92.
Lawson et al., "Preparation of Single Crystals", Semi-Conductor Monographs, 1958, pp. 18-21.
Lee et al., "Light Extraction Analysis of GaN-Based Light-Emitting Diodes with Surface Texture and/or Patterned Substrate", Optics Express, vol. 15, No. 11, 2007, pp. 6670-6676.
Liu et al., "A Global Growth Rate Model for Aluminum Nitride Sublimation", Journal of the Electrochemical Society, vol. 149, No. 1, 2002, pp. G12-G15.
Liu et al., "Misfit Dislocation Generation in InGaN Epilayers on Free-Standing GaN", Japanese Journal of Applied Physics, vol. 46, No. 22, 2006, pp. L549-L551.
Lobo et al., "Enhancement of Light Extraction in Ultraviolet Light-Emitting Diodes using Nanopixel Contact Design with Al Reflector", Applied Physics Letters, vol. 96, 2010, pp. 081109-1-081109-3.
Ludwig et al., "Dimers [Al2N4]", Zeitsch. f. Naturforsch., B54, 1999, pp. 461-465.
Maier et al., "Enhancement of (AlGaIn)N near-UV LED Efficiency Using Freestanding GaN Substrate", Physica Status Solidi (c), vol. 5, No. 6, 2008, pp. 2133-2135.
Mason et al., "Optically Detected Electron Paramagnetic Resonance of AlN Single Crystals", Physical Review B, vol. 59, No. 3, Jan. 15, 1999, pp. 1937-1947.
Matthews et al., "Defects in Epitaxial Multilayers", Journal of Crystal Growth, vol. 27, 1974, p. 118-125.
Meyer et al., "Defects and Defect Identication in Group III-Nitrides", Material Science Engineering, vol. B71, 2000, pp. 69-76.
Mokhov et al., "Sublimation Growth of AlN Bulk Crystals in Ta Crucibles", Journal of Crystal Growth, vol. 281, 2005, pp. 93-100.
Morita et al., "Optical Absorption and Cathodoluminescence of Epitaxial Aluminum Nitride Films", Japanese Journal of Applied Physics, vol. 21, No. 7, 1982, pp. 1102-1103.
Naidu et al., "Phase Diagrams of Binary Tungsten Alloys", Indian Institute of Metals, Calcutta, 1991, 11 pages.
Nakahata et al., "Electron Spin Resonance Analysis of Lattice Defects in Polycrystalline Aluminum Nitride", Journal of the American Ceramic Society, vol. 80, No. 6, Jun. 1997, pp. 1612-1614.
Nakanishi et al., "Effects of Al Composition on Luminescence Properties of Europim Implanted AlxGa1-xN (0≤x≤1)", Physica Status Solidi (c), vol. 0, No. 7, 2003, pp. 2623-2626.
Nakarmi et al., "Photoluminescence Studies of Impurity Transitions Mg-Doped AlGaN Alloys", Applied Physics Letters, vol. 94, 2009, pp. 091903-1-091903-3.
Nam et al., "Deep Impurity Transitions Involving Cation Vacancies and Complexes in AlGaN Alloys", Applied Physics Letters, vol. 86, 2005, pp. 222108-1-222108-3.
Nassau, Kurt, "The Physics and Chemistry of Color: The Fifteen Causes of Color", Wiley-Interscience Publication, 1983, 3 pages.
Nepal et al., "Optical Properties of the Nitrogen Vacancy in AlN Epilayers", Applied Physics Letters, vol. 84, No. 7, Feb. 16, 2004, pp. 1090-1092.
Niewa et al , "Li3[ScN2]: The First Nitridoscandate (III)—Tetrahedral Sc Coordination and Unusual MX2 Framework", Chemistry—A European Journal, vol. 9, 2003, pp. 4255-4259.
Niewa et al., "Recent Developments in Nitride Chemistry", Chemical of Materials, vol. 10, No. 10, Oct. 2, 1998, pp. 2733-2752.
Nishida et al., "340-350 nm GaN-free UV-LEDs", Physica Status Solidi (a), vol. 200, No. 1, 2003, pp. 106-109.
Nishida et al., "AlGaN-Based Ultraviolet Light-Emitting Diodes Grown on Bulk AlN Substrates", Applied Physics Letters, vol. 84, No. 6, Feb. 9, 2004, pp. 1002-1003.
Noveski et al., "Mass Transfer in AlN Crystal Growth at High Temperatures", Journal of Crystal Growth, vol. 264, 2004, pp. 369-378.
Pantha et al., "Correlation between Biaxial Stress and Free Exciton Transition in AlN Epilayers", Applied Physics Letters, vol. 91, 2007, pp. 121117-1-201117-3.
Park et al., "Study on Photoluminescence of GaN-Based UV-LEDs with Refractive Index Gradient Polymeric Nanopatterns", Journal of Crystal Growth, vol. 326, 2011, pp. 28-32.
Parker et al., "Determination of Critical Layer in the InGaN/GaN Heterostructures", Applied Physics Letters, vol. 75, No. 18, Nov. 1, 1999, pp. 2776-2778.
Pernot et al., "Improved Efficiency of 255-280 nm AlGaN-Based Light-Emitting Diodes", Applied Physics Express, vol. 3, 2010, p. 061004 (3 pages).
Perry et al., "The Optical Absorption Edge of Single-Crystal AlN Prepared by a Close-Spaced Vapor Process", Applied Physics Letter, vol. 33, No. 4, Aug. 15, 1978, pp. 319-321.
Raghothamachar et al., "Synchrotron White Beam Topography Characterization of Physical Vapor Transport Grown AlN and Ammonothermal GaN", Journal of Crystal Growth, vol. 246, 2002, pp. 271-280.
Raghothamachar et al., "X-ray Characterization of Bulk AlN Single Crystals Grown by the Sublimation Technique", Journal of Crystal Growth, vol. 250, 2003, pp. 244-250.
Rojo et al., "Growth and Characterization of Epitaxial Layers on Aluminum Nitride Substrates Prepared from Bulk, Single Crystals", Journal of Crystal Growth, vol. 240, 2002, pp. 508-512.
Rojo et al., "Progress in the Preparation of Aluminum Nitride Substrates from Bulk Cystals", Mat. Res. Soc. Svmp. Pro., vol. 722, 2002, pp. K1.1.1-K1.1.9.
Rojo et al., "Report on the Growth of Bulk Aluminum Nitride and Subsequent Substrate Preparation", Journal of Crystal Growth, vol. 231, 2001, pp. 317-321.
Salzman et al., "Reduction of Oxygen Contamination in AlN", Physica Status Solidi (c), 2003, pp. 2541-2544.
Sarua et al., "Effect of Impurities on Raman and Photoluminescence Spectra of AlN Bulk Crystals", Materials Research Society Symposium Proceedings, vol. 798, 2004, pp. Y5.17.1-Y5.17.6.
Schlesser et al., "Crucible Materials for Growth of Aluminium Nitride Crystals", Journal of Crystal Growth, vol. 281, 2005, pp. 75-80.

(56) References Cited

OTHER PUBLICATIONS

Schlesser et al., "Seeded Growth of AlN Bulk Single Crystals by Sublimation", Journal of Crystal Growth, vol. 241, 2002, pp. 416-420.
Examination Report received for European Application No. 02803675.4, mailed on May 2, 2007, 4 pages.
Examination Report received for European Application No. 02806723.9, mailed on Jan. 17, 2008, 4 pages.
Examination Report received for European Application No. 02806723.9, mailed on Feb. 7, 2007, 4 pages.
Examination Report received for European Application No. 02806723.9, mailed on Feb. 16, 2010, 2 pages.
Examination Report received for European Application No. 02806723.9, mailed on Aug. 8, 2008, 3 pages.
Examination Report received for European Application No. 03808366.3 mailed on Sep. 28, 2006, 4 pages.
Summons to Attend Oral Proceedings in European Patent Application No. 03808366.3, mailed on Dec. 17, 2007, 5 pages.
Examination Report received for European Application No. 06844804.2, mailed on Mar. 4, 2009, 3 pages.
Examination Report received for European Application No. 07774299.7, mailed on Jul. 25, 2014, 6 pages.
Examination Report received for Canadian Application No. 2,467,806, mailed on Feb. 23, 2010, 2 pages.
Examination Report received for Canadian Patent Application No. 2,467,806, mailed on Aug. 13, 2009, 4 pages.
Examination Report received for Australian Application No. 2003303485, mailed on Oct. 9, 2008, 2 pages.
Examination Report received for Chinese Application No. 200880005464.4, mailed on Sep. 9, 2013, 10 pages (7 pages of English Translation and 3 pages of Official Copy).
Examination Report received for Chinese Application No. 200880005464.4, mailed on Mar. 31, 2014, 5(2 pages of English Translation & 3 pages of Official copy).
Examination Report received for Chinese Application No. 200880005464.4, mailed on Jul. 3, 2014, 7(3 pages of English Translation & 4 pages of Official copy).
Examination Report received for Japanese Application No. 2003-545445, mailed on Sep. 30, 2008, 3 pages (English Translation only).
Examination Report received for Japanese Application No. 2003-545445, mailed on Nov. 10, 2009, 3 pages (English Translation only).
Examination Report received for Japanese Application No. 2008-543389, mailed on Aug. 20, 20137, 13 pages (6 pages of English Translation & 7 pages of Official copy).
Examination & Report received for Japanesese Application No. 2008-543389, mailed on May 22, 2012, 13 pages (6 pages of English Translation & 7 pages of Official copy).
Examination Report received for Japanese Application No. 2008-543541, mailed on May 15, 2012, 8 pages (4 pages of English Translation & 4 pages of Official Copy).
Notice of Allowance received for Japanese Application No. 2009-503043, mailed on Jan. 21, 2014, 3 pages (2 pages of English Translation and 1 page of Official Copy).
Examination Report received for Japanese Application No. 2009-547307, mailed on Apr. 8, 2014, 7 pages (3 pages of English Translation and 4 page of Official Copy).
Examination Report received for Japanese Application No. 2013-518701, mailed on Sep. 24, 2014, 5 (2 pages of English Translation & 3 pages of Official Copy).
PCT International Application No. PCT/US2006/022329, International Preliminary Report on Patentability issued on Dec. 11, 2007, 7 pages.
PCT International Application No. PCT/US2006/022329, International Search Report and Written Opinion mailed on Dec. 12, 2006, 10 pages.
PCT International Application No. PCT/US2006/045540, International Preliminary Report on Patentability issued on Jun. 3, 2008, 12 pages.
PCT International Application No. PCT/US2006/045540, International Search Report and Written Opinion mailed on Jul. 6, 2007, 18 pages.
PCT International Application No. PCT/US2006/046300, International Preliminary Report on Patentability, issued on May 30, 2007, 10 pages.
PCT International Application No. PCT/US2006/046300, International Search Report and Written Opinion, issued on May 30, 2007, 10 pages.
PCT International Application No. PCT/US2007/011075, International Search Report and Written Opinion mailed on Jul. 11, 2008, 15 pages.
PCT International Application No. PCT/US2007/011075, Partial International Search Report mailed on May 7, 2008, 2 pages.
PCT International Application No. PCT/US2007/007980, International Search Report and Written Opinion mailed on Oct. 12, 2007, 14 pages.
PCT International Application No. PCT/US2008/000597, International Search Report and Written Opinion mailed on May 20, 2008, 9 pp.
PCT International Application No. PCT/US2008/000597, International Preliminary Report on Patentability mailed on Jul. 30, 2009, 7 pages.
PCT International Application No. PCT/US2008/001003, International Search Report and Written Opinion mailed on Aug. 5, 2008, 9 pages.
PCT International Application No. PCT/US2008/001003, International Preliminary Report on Patentability mailed on Aug. 6, 2009, 7 pages.
PCT International Application No. PCT/US2014/025317, International Search Report and Written Opinion mailed Aug. 27, 2014, 13 pages.
Van De Walle et al., "Doping of AlGaN Alloys", MRS Internet Journal Nitride Semiconductor Research., 4S1, G10.4,1999, pp. 1-12.
Van De Walle et al., "First-Principles Calculations for Defects and Impurities: Applications to III-Nitrides" Journal of Applied Physics, vol. 95, No. 8, Apr. 15, 2004, pp. 3851-3879.
Vendl et al., "The Melting Points of Some Rare-Earth Metal Nitrides as a Function of Nitrogen Pressure", High Temperatures-High Pressures, vol. 9, 1977, pp. 313-318.
Venugopal et al., "Comparison of Various Buffer Schemes to Grow GaN on Large-Area Si(111) Substrates Using Metal-Organic Chemical-Vapor Deposition", Journal of Electronic Materials, vol. 32, No. 5, 2003, pp. 371-374.
Watanabe et al., "Changes in Optical Transmittance and Surface Morphology of AlN Thin Films Exposed to Atmosphere", Journal of Materials Research, vol. 13, No. 10, Oct. 1998, pp. 2956-2961.
Wentorf, R. H., Jr., "Synthesis of the Cubic Form of Boron Nitride", Journal of Chemical Physics, vol. 34, No. 3, Mar. 1961, pp. 809-812.
Wierer, Jonathan J., Jr., "Light Extraction Methods in Light-Emitting Diodes", Optical Society of America/CLEO, 2011, 2 pages.
Wongchotigul et al., "Low Resistivity Aluminum Nitride:Carbon (AlN:C) Films Grown by Metal Organic Chemical Vapor Deposition", Materials Letters, vol. 26, Mar. 1996, pp. 223-226.
Yamane et al., "Preparation of GaN Single Crystals Using a Na Flux", Chemical Materials, vol. 9, No. 2, 1997, pp. 413-416.
Yano et al., "Growth of Nitride Crystals, BN, AlN and GaN by Using a Na Flux", Diamond and Related Materials, vol. 9, 2000, pp. 512-515.
Zeisel et al., "DX-Behavior of Si in AlN", Physical Review B, Condensed Matter and Materials Physics, Third Series, vol. 61, No. 24, 2000, pp. R16283-R16286.
Zhmakin, A I., "Enhancement of Light Extraction from Light Emitting Diodes", Physics Reports, vol. 498, 2011, pp. 189-241.
Zhuang et al., "Seeded Growth of AlN Single Crystals by Physical Vapor Transport", Journal of Crystal Growth, vol. 287, 2006, pp. 372-375.
Schowalter et al., "Fabrication of Native, Single-Crystal AlN Substrates", Physica Status Solidi (c), 2003, pp. 1-4.
Schujman et al., "Very Low Dislocation Density AlN Substrates for Device Applications", Proc. Of SPIE, 2006, vol. 6121, 2006, pp. 61210K-1-61210K-7.

(56) References Cited

OTHER PUBLICATIONS

Schweizer et al., "Investigation of Oxygen-Related Luminescence Centres in AlN Ceramics", Physica Status Solidi (b), vol. 219, No. 1, 2000, pp. 171-180.

Sedhain et al., "Photoluminescence Properties of AlN Homoepilayers with Different Orientations", Applied Physics Letters, vol. 93, 2008, pp. 041905-1-041905-3.

Segal et al., "On Mechanisms of Sublimation Growth of AlN bulk Crystals", Journal of Crystal Growth, vol. 211, 2000, pp. 68-72.

Seo et al., "Enhanced Light Output Power of Near UV Light Emitting Diodes with Graphene / Indium Tin Oxide Nanodot Nodes for Transparent and Current Spreading Electrode", Optics Express, vol. 9, No. 23, Nov. 7, 2011, pp. 23111-23117.

Shakya et al., "III-Nitride Blue and UV Photonic Crystal Light-Emitting Diodes", Fourth International Conference on Solid State Lighting, Proc. of SPIE, vol. 5530, pp. 241-250.

Shatalov et al., "AlGaN Deep-Ultraviolet Light-Emitting Diodes with External Quantum Efficiency above 10%", Applied Physics Express, vol. 5, 2012, pp. 082101(3 pages).

Shi et al., "Luminescence Properties of Wurtzite AlN Nanotips", Applied Physics Letters, vol. 89, 2006, pp. 163127-1-163127-3.

Shih et al., "High-Quality and Crack-Free $Al_xGa_{1-x}N$ (x-0.2) Grown on Sapphire by a Two-Step Growth Method", Journal of Crystal Growth, vol. 277, 2005, pp. 44-50.

Silveira et al., "Excitonic Structure of Bulk AlN from Optical Reflectivity and Cathodoluminescense Measurements", Physical Review B, vol. 71, 2005, pp. 041201-1-041201-4.

Singh et al., "Physical Vapor Transport Growth of Large AlN Crystals", Journal of Crystal Growth, vol. 250, 2003, pp. 107-112.

Slack et al., "AlN Single Crystals", Journal of Crystal Growth, vol. 42, 1977, pp. 560-563.

Slack et al., "Growth of High Purity AlN Crystals", Journal of Crystal Growth, vol. 34, 1976, pp. 263-279.

Slack et al., "Properties of Crucible Materials for Bulk Growth of AlN", Materials Research Society Symposium Proceedings, vol. 798, 2004, pp. Y10.74.1-Y10.74.4.

Smart et al., "AlGaN/GaN Heterostructures on Insulating AlGaN Nucleation Layers", Applied Physics Letters, vol. 75, No. 3, Jul. 10, 1999, pp. 388-390.

Song, T. L. , "Strain Relaxation Due to V-Pit Formation in $In_xGa_{1-x}N$/GaN Epilayers Grown on Sapphire", Journal of Applied Physics, vol. 98, 2005, pp. 084906-1-084906-9.

Strassburg et al., "The Growth and Optical Properties of Large, High-Quality AlN Single Crystals", Journal of Applied Physics, vol. 96, No. 10, Nov. 15, 2004, pp. 5870-5876.

Sun et al., "Phase Relationships in the System Y-Al-O-N", Materials Letters, vol. 11, No. 3,4, May 1991, pp. 67-69.

Takehara et al., "Indium-Tin Oxide/Al Reflective Electrodes for Ultraviolet Light-Emitting Diodes", Japanese Journal of Applied Physics, vol. 51, 2012, p. 042101 (4 pages).

Takeuchi et al., "Optical Properties of Strained AlGaN and GaInN on GaN", Japanese Journal of Applied Physics, vol. 36, Part 2, No. 2B, Feb. 15, 1997, pp. L177-L179.

Takeya et al., "Degradation in AlGaInN Lasers", Physica Status Solidi (c), 2003, pp. 2292-2295.

Taniyasu et al., "An Aluminium Nitride Light-Emitting Diode with a Wavelength of 210 Nanometres", Nature, vol. 441, May 18, 2006, pp. 325-328.

Taniyasu et al., "Intentional Control of N-Type Conduction for Si-Doped AlN and $Al_xGa_{1-x}N$ (0.42<x<1)", Applied Physics Letters, vol. 81, No. 7, Aug. 12, 2002, pp. 1255-1257.

Tavernier et al., "Chemical Mechanical Polishing of Gallium Nitride", Electrochemical and Solid State Letters, vol. 5, No. 8, 2002, pp. G61-G64.

Thomas et al., "Determination of the Concentration of Oxygen Dissolved in the AlN Lattice by Hot Gas Extraction from AlN Ceramics", Journal of European Society, vol. 8, 1991, pp. 11-19.

Tomiya et al., "Dislocations in GaN-Based Laser Diodes on Epitaxial Lateral Overgrown GaN Layers", Physica Status Solidi (a), vol. 188, No. 1, 2001, pp. 69-72.

Trinkler et al., "Radiation Induced Recombination Processes in AlN Ceramics", Journal of Physics: Condensed Matter, vol. 13, 2001, pp. 8931-8938.

Trinkler et al., "Spectral Properties of AlN Ceramics", SPIE, vol. 2967, 1997, pp. 85-88.

Trinkler et al., "Stimulated Luminescence of AlN Ceramics Induced by Ultraviolet Radiation", Radiation Measurements, vol. 33, 2001, pp. 731-735.

Tsao, Jeff Y. , "Solid-State Lighting: Lamps, Chips and Materials for Tomorrow", Circuits and Devices Magazine, IEEE, May/Jun. 2004, pp. 28-37.

Tuomisto et al., "Characterization of Bulk AlN Crystals with Positron Annihilation Spectroscopy", Journal of Crystal Growth, 2008, pp. 1-4.

Vail et al., "The Nitrogen Vacancy in Aluminium Nitride", Journal of Physics: Condensed Matter, vol. 18, 2006, pp. 2125-2135.

Vinogradov et al., "Determination of the Melting Parameters of Aluminum Nitride", High Temperatures—High Pressures, vol. 23, 1991, pp. 685-688.

\* cited by examiner

| | |
|---|---|
| 400 | Evacuate chamber |
| 405 | Refill chamber with nitrogen gas |
| 410 | Repeat steps 400 and 405 |
| 415 | Pressurize chamber to 1 bar with a gas including, e.g., 95-100% $N_2$ and 0-5% $H_2$ |
| 420 | Place source material in proximal end of crucible |
| 425 | Place crucible in susceptor with its distal end in the high-temperature region |
| 430 | Increase temperature of the crucible to about 1800 °C |
| 435 | Maintain gas at a predetermined super-atmospheric pressure |
| 440 | Ramp temperature to growth temperature |
| 445 | During step 440, continuously adjust pressure to maintain it at the pressure of step 435 |
| 450 | Once growth temperature is reached, drive mechanism is actuated to move crucible relative to the heated zone |
| 455 | Maintain constant pressure during step 450 |
| 460 | Stop movement of the crucible |
| 465 | Cool crucible to room temperature |

GROWTH OF LARGE ALUMINUM NITRIDE SINGLE CRYSTALS WITH THERMAL-GRADIENT CONTROL

RELATED APPLICATION

This application claims the benefit of and priority to U.S. Provisional Patent Application No. 61/360,142, filed Jun. 30, 2010, the entire disclosure of which is hereby incorporated herein by reference.

GOVERNMENT SUPPORT

This invention was made with United States Government support under contract number DE-FC26-08-NT01578 awarded by the Department of Energy (DOE). The United States Government has certain rights in the invention.

FIELD OF THE INVENTION

In various embodiments, the present invention relates to systems and methods for fabricating nitride-based crystals, in particular systems and methods featuring enhanced control over the axial and radial thermal gradients during crystal growth.

BACKGROUND

Aluminum nitride (AlN) holds great promise as a semiconductor material for numerous applications, e.g., optoelectronic devices such as short-wavelength light-emitting diodes (LEDs) and lasers, dielectric layers in optical storage media, electronic substrates, and chip carriers where high thermal conductivity is essential, among many others. In principle, the properties of AlN may allow light emission at wavelengths down to around 200 nanometers (nm) to be achieved. Recent work has demonstrated that ultraviolet (UV) LEDs have superior performance when fabricated on low-defect AlN substrates prepared from bulk AlN single crystals. The use of AlN substrates is also expected to improve high-power radio-frequency (RF) devices made with nitride semiconductors due to the high thermal conductivity with low electrical conductivity. However, the commercial feasibility of AlN-based semiconductor devices is limited by the scarcity and high cost of large, low-defect single crystals of AlN.

To make large-diameter AlN substrates more readily available and cost-effective, and to make the devices built thereon commercially feasible, it is desirable to grow large-diameter (>25 mm) AlN bulk crystals at a high growth rate (>0.5 mm/hr) while preserving crystal quality. The most effective method of growing AlN bulk single crystals is the "sublimation-recondensation" method that involves sublimation of lower-quality (typically polycrystalline) AlN source material and recondensation of the resulting vapor to form the single-crystal AlN. U.S. Pat. No. 6,770,135 (the '135 patent), U.S. Pat. No. 7,638,346 (the '346 patent), and U.S. Pat. No. 7,776,153 (the '153 patent), the entire disclosures of which are incorporated by reference herein, describe various aspects of sublimation-recondensation growth of AlN, both seeded and unseeded. While these references recognize the benefits of a large axial (i.e., parallel to the primary growth direction) thermal gradient for optimizing material quality and growth rate of the growing AlN crystal, they utilize a growth apparatus designed to minimize the radial (i.e., perpendicular to the primary growth direction) thermal gradient. For example, axial thermal gradients may range from approximately 5° C./cm to approximately 100° C./cm, while radial thermal gradients are maintained at as negligible a level as possible. Likewise, other prior-art growth apparatuses utilize heavy insulation in order to minimize or eliminate the radial thermal gradient, as a minimized radial thermal gradient is expected to produce flat, high-quality crystals, particularly when efforts are made to grow crystals having large diameters. The radial gradient is typically minimized during conventional crystal growth in order to prevent formation of defects such as dislocations and low-angle grain boundaries. It is also minimized to make the surface of the growing crystal more flat, thus increasing the amount of usable material in the crystal (i.e., increasing the number of substrates that can be cut from the crystal for a given length of crystal).

FIG. 1 depicts an apparatus 100 utilized for the growth of AlN in accordance with the above-described prior art. As shown, a crucible 105 is positioned on top of a crucible stand 110 within a cylindrical susceptor 115. During the growth process, the susceptor 115 is translated within a heated zone created by surrounding heating coils (not shown), polycrystalline AlN source material 120 at the base 125 of the crucible sublimes at the elevated temperature, and the resulting vapor recondenses at the cooler tip 130 of the crucible due to the large axial thermal gradient between the base 125 and the tip 130, thus forming an AlN crystal 135. The apparatus 100 also features top axial shields 140 and bottom axial shields 145 designed and positioned to minimize the radial thermal gradient perpendicular to the growth direction 150 of AlN crystal 135. As shown, the tip 130 of the crucible 105 is cooler than the base 125 at least in part because apparatus 100 has fewer top axial shields 140 than bottom axial shields 145, allowing more heat to escape in the region of tip 130 and generating the desired axial thermal gradient. The top axial shields 140 may have centered holes therewithin to facilitate measurement of the temperature at tip 130 by a pyrometer 155. The centered hole diameter is minimized to reduce the heat flow but sufficient to form a practical optical path for the temperature sampling by the pyrometer 155. Additional pyrometers 160, 165 may also be utilized to measure temperatures at other regions of apparatus 100.

As mentioned above, the ability to grow AlN single crystals at high growth rates would spur additional commercial adoption of the technology. While increasing the growth rate of AlN crystals is theoretically possible by increasing the Al supersaturation using larger axial thermal gradients, increases in the Al supersaturation may result in deterioration of the material quality of the crystal, or even in polycrystalline, rather than single-crystal, growth. Furthermore, the minimization or elimination of radial thermal gradients during AlN crystal growth unexpectedly tends to deleteriously impact the quality of the AlN crystal, particularly when attempts are made to grow large (e.g., >25 mm diameter) crystals at reasonable growth rates (e.g., >0.5 mm/hr). Thus, a need exists for systems and techniques enabling growth of such large AlN crystals at high growth rates while still preserving high material quality of the AlN crystal.

SUMMARY

Embodiments of the current invention achieve high growth rates (e.g., greater than approximately 0.5 mm/hr) of large, high-quality single-crystal semiconductors (e.g., AlN) by forming and maintaining non-zero axial and radial thermal gradients in the growth apparatus such that the ratio of the axial thermal gradient to the radial thermal gradient (the "thermal gradient ratio") is greater than zero and less than 10. (As utilized herein, a thermal gradient being maintained does not necessarily imply that it is held constant as a function of time, only that it is non-zero (and constant or fluctuating) over a period of time.) The size and the quality of growing crystals are generally influenced by the thermal field within the growth cell. The axial thermal gradient is the magnitude of the thermal field projected on the longitudinal symmetry axis in a cylindrical coordinate system. The radial thermal gradient is the projection of the thermal field magnitude on the azimuthal direction. Therefore, the thermal gradient in any other direction may be described as a superposition of the axial and radial thermal gradients (and thus may also be controlled as the axial and/or radial thermal gradients are controlled). The deliberate formation and control of the radial thermal gradient large enough to result in a thermal gradient ratio less than 10 contradicts the above-described conventional wisdom in which radial thermal gradients (which may depend at least in part on the dimensions and shape of the growth chamber), even if formed at all (e.g., unintentionally) are eliminated or minimized to small magnitudes.

In some embodiments, the radial thermal gradient and the axial thermal gradient are substantially balanced and, preferably, the thermal gradient ratio ranges from approximately 1.2 to approximately 5.5. In order to facilitate formation and control of the radial thermal gradients, crystal-growth apparatuses in accordance with various embodiments of the invention utilize different types, thicknesses, and/or arrangements of thermal shields, particularly in the area "behind" the growing crystal (i.e., corresponding to the location of the top axial shields 140 in FIG. 1). Thus, for embodiments featuring seeded growth of AlN single crystals, one or more shields are typically located opposite the growth surface of the seed. The one or more shields utilized in preferred embodiments of the invention include or consist essentially of one or more refractory materials, e.g., tungsten, and may be substantially thin, i.e., have thicknesses less than 0.5 mm, e.g., ranging from 0.125 mm to 0.5 mm.

In one aspect, embodiments of the invention feature a method of forming single-crystal aluminum nitride (AlN). Vapor comprising or consisting essentially of aluminum and nitrogen is condensed within a growth chamber, thereby forming an AlN single crystal that increases in size along a growth direction. During the formation, a first (e.g., axial) non-zero thermal gradient is formed and maintained within the growth chamber in a direction substantially parallel to the growth direction, and a second (e.g., radial) non-zero thermal gradient is formed and maintained within the growth chamber in a direction substantially perpendicular to the growth direction. The ratio of the first thermal gradient to the second thermal gradient is less than 10.

Embodiments of the invention may include one or more of the following in any of a variety of combinations. Solid source material (which may include or consist essentially of, e.g., polycrystalline AlN) may be sublimed within the growth chamber to form the vapor. The second thermal gradient may be larger than 4° C./cm and/or smaller than 85° C./cm. The ratio of the first thermal gradient to the second thermal gradient may be greater than 1.2. The first thermal gradient may be larger than 5° C./cm and/or smaller than 100° C./cm. The ratio of the first thermal gradient to the second thermal gradient may be less than 5.5, or even less than 3.

Forming the second thermal gradient may include or consist essentially of arranging a plurality of thermal shields outside the growth chamber. Each of the thermal shields may include or consist essentially of a refractory material, e.g., tungsten. Each thermal shield may define an opening therethrough. The openings of the thermal shields may be substantially equal in size to each other. The opening of each thermal shield may range from approximately 10 mm to approximately 2 mm less than the dimension of the growth chamber substantially perpendicular to the growth direction. The openings of at least two of the thermal shields may be different in size. A first thermal shield having a first opening may be disposed between the growth chamber and a second thermal shield, the second thermal shield having a second opening larger than the first opening. At least two of the thermal shields may have different thicknesses. The thickness of each of the thermal shields may range from approximately 0.125 mm to approximately 0.5 mm.

The growth chamber may include a lid disposed between the AlN single crystal and at least one (or even all) of the thermal shields. The thickness of the lid may be less than approximately 0.5 mm. The lid may include or consist essentially of tungsten. A seed may be disposed within the growth chamber before forming the AlN single crystal, and the AlN single crystal may form on the seed and extend therefrom in the growth direction. The diameter of the seed may be greater than approximately 25 mm. The growth rate of the AlN single crystal may be greater than approximately 0.5 mm/hr. The AlN single crystal may form on a seed disposed within the growth chamber.

In another aspect, embodiments of the invention feature a crystal-growth system including or consisting essentially of a growth chamber for the formation of a single-crystal semiconductor material via sublimation-recondensation therewithin along a growth direction, a heating apparatus for heating the growth chamber, and a plurality of thermal shields arranged to form, within the growth chamber, (i) a first non-zero thermal gradient in a direction substantially parallel to the growth direction and (ii) a second non-zero thermal gradient in a direction substantially perpendicular to the growth direction. The ratio of the first thermal gradient to the second thermal gradient is less than 10.

Embodiments of the invention may include one or more of the following in any of a variety of combinations. Each thermal shield may define an opening therethrough. The openings of at least two of the thermal shields may be different in size. A first thermal shield having a first opening may be disposed between the growth chamber and a second thermal shield, the second thermal shield having a second opening larger than the first opening. At least two of the thermal shields may have different thicknesses. The thickness of each of the thermal shields may range from approximately 0.125 mm to approximately 0.5 mm. Each of the thermal shields may include or consist essentially of a refractory material, e.g., tungsten. The thermal shields may be arranged with substantially equal spacings therebetween. A seed for nucleating the single-crystal semiconductor material thereon may be disposed within the growth chamber. The diameter of the seed may be greater than approximately 25 mm, and/or the seed may include or consist essentially of aluminum nitride. The ratio of the first thermal gradient to the second thermal gradient may be less than 5.5, or even less than 3. The ratio of the first thermal gradient to the second thermal gradient may be greater than 1.2.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Unless otherwise indicated, "radial" generally refers to a direction substantially perpendicular to the primary crystal growth direction and/or the long axis of the crystal and/or the crystal-growth apparatus. Refractory materials are generally materials that are physically and chemically stable at temperatures above approximately 500° C. As used herein, the term "substantially" means±10%, and, in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 4 is a table listing various steps of a process for growth of semiconductor crystals such as AlN in accordance with various embodiments of the invention.

DETAILED DESCRIPTION

Figure 1:
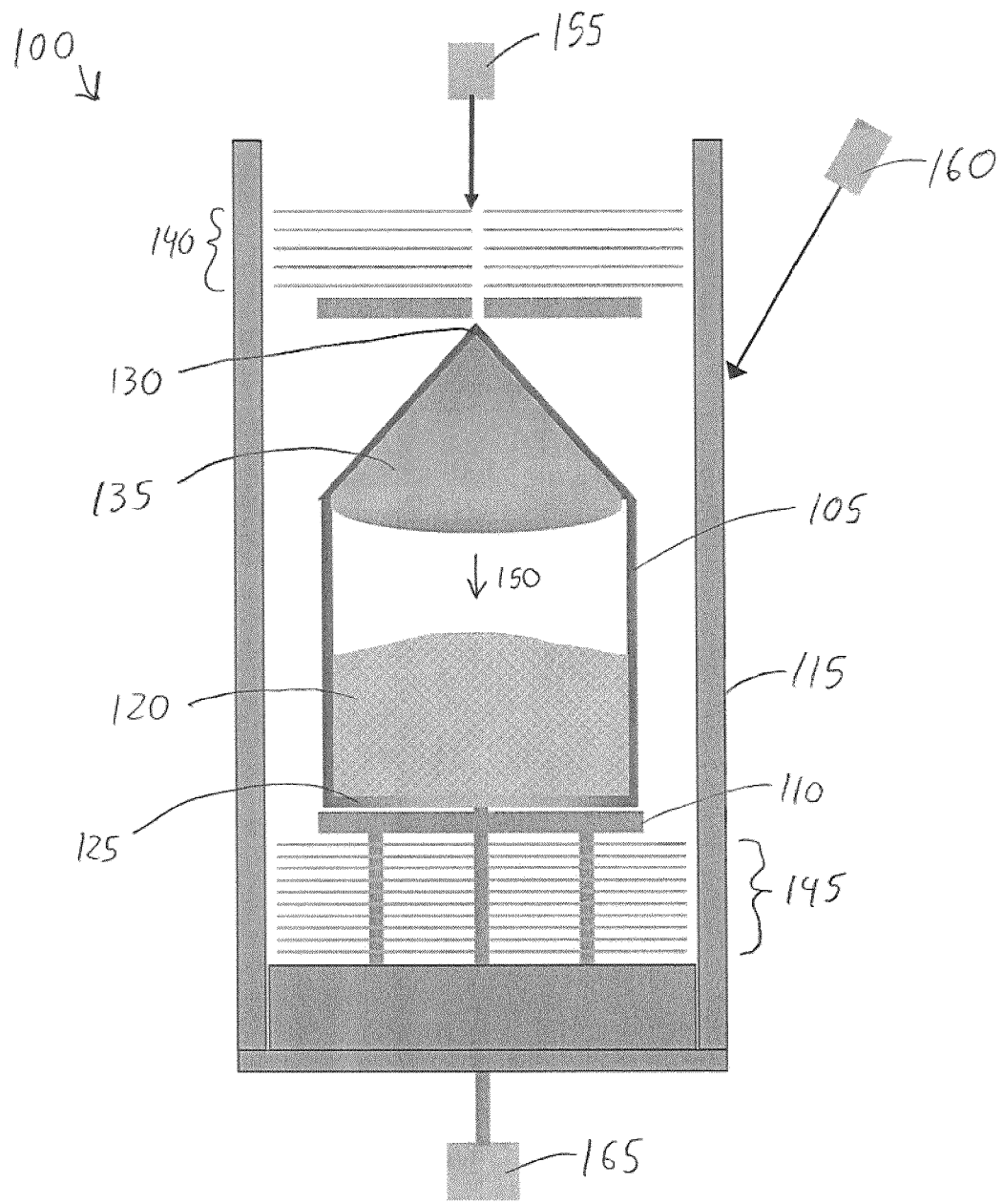
FIG. 1 is a schematic cross-section of a crystal-growth apparatus in accordance with the prior art in which radial thermal gradients are minimized or eliminated.
Figure 2:
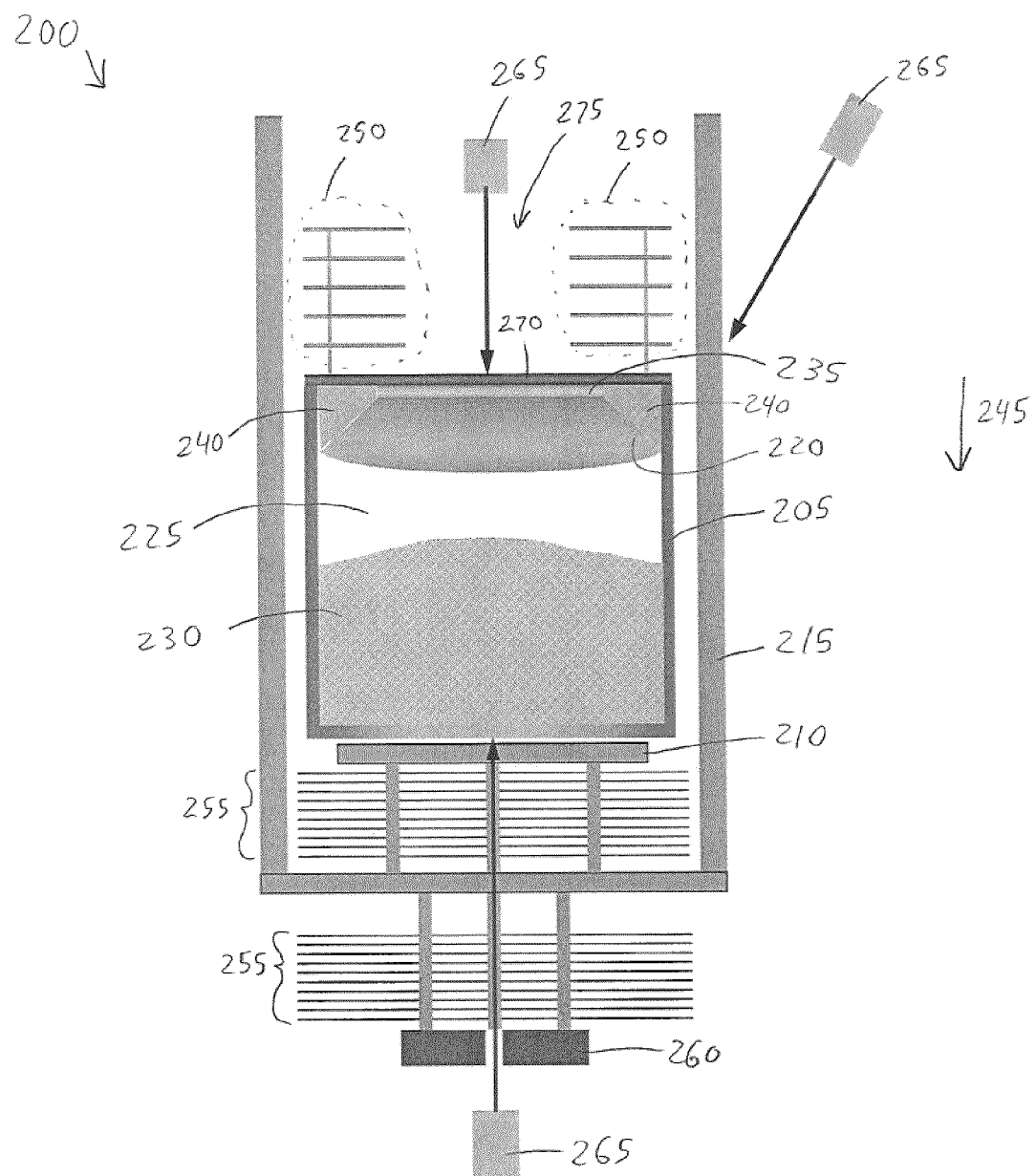
FIG. 2 is a schematic cross-section of a crystal-growth apparatus in accordance with various embodiments of the invention in which radial thermal gradients are generated and/or controlled.

FIG. 2 depicts a crystal-growth apparatus 200 suitable for the growth of single-crystal semiconductor materials (e.g., AlN, $Al_xGa_{1-x}N$, $B_xAl_{1-x}N$, and/or $B_xGa_yAl_{1-x-y}N$) in accordance with various embodiments of the present invention. As shown, apparatus 200 includes a crucible 205 positioned on top of a crucible stand 210 within a susceptor 215. Both the crucible 205 and the susceptor 215 may have any suitable geometric shape, e.g., cylindrical. During a typical growth process, the semiconductor crystal 220 is formed by condensation of a vapor 225 that includes or consists essentially of the elemental and/or compound precursors of the semiconductor crystal 220. For example, for a semiconductor crystal 220 including or consisting essentially of AlN, vapor 225 may include or consist essentially of Al and N atoms and/or $N_2$ molecules. In preferred embodiments, the vapor 225 arises from the sublimation of a source material 230, which may include or consist essentially of the same material as semiconductor crystal 220, only in polycrystalline form. Source material 230 may be substantially undoped or doped with one or more dopants, and use of a doped source material 230 typically results in semiconductor crystal 220 incorporating the dopant(s) present in source material 230. The semiconductor crystal 220 may form on and extend from a seed crystal 235. (Alternatively, the semiconductor crystal 220 may nucleate upon and extend from a portion of the crucible 205 itself, in the manner depicted in FIG. 1.) The seed crystal 235 may be a single crystal (e.g., a polished wafer) including or consisting essentially of the same material as semiconductor crystal 220 or may be a different material.

The crucible 205 may include or consist essentially of one or more refractory materials, such as tungsten, rhenium, and/or tantalum nitride. As described in the '135 patent and the '153 patent, the crucible 205 may have one or more surfaces (e.g., walls) configured to selectively permit the diffusion of nitrogen therethrough and selectively prevent the diffusion of aluminum therethrough.

As shown in FIG. 2, during formation of the semiconductor crystal 220, a polycrystalline material 240 may form at one or more locations within the crucible 205 not covered by the seed crystal 235. However, the diameter (or other radial dimension) of the semiconductor crystal 220 may expand, i.e., increase, during formation of the semiconductor crystal 220, thereby occluding the regions of polycrystalline material 240 from impinging vapor 225 and substantially limiting or even eliminating their growth. As shown in FIG. 2, the diameter of the semiconductor crystal 220 may expand to (or even start out at, in embodiments utilizing larger seed crystals 235) be substantially equal to the inner diameter of the crucible 205 (in which case no further lateral expansion of the semiconductor crystal 220 may occur).

The growth of the semiconductor crystal 220 along a growth direction 245 typically proceeds due to a relatively large axial thermal gradient (e.g., ranging from approximately 5° C./cm to approximately 100° C./cm) formed within the crucible 205. A heating apparatus (not shown in FIG. 2 for clarity), e.g., an RF heater, one or more heating coils, and/or other heating elements or furnaces, heats the susceptor 215 (and hence the crucible 205) to an elevated temperature typically ranging between approximately 1800° C. and approximately 2300° C. The apparatus 200 features one or more sets of top thermal shields 250, as well as one or more sets of bottom axial thermal shields 255, arranged to create the large axial thermal gradient (by, e.g., better insulating the bottom end of crucible 205 and the source material 230 from heat loss than the top end of crucible 205 and the growing semiconductor crystal 220). During the growth process, the susceptor 215 (and hence the crucible 205) may be translated within the heating zone created by the heating apparatus via a drive mechanism 260 in order to maintain the axial thermal gradient near the surface of the growing semiconductor crystal 220. One or more pyrometers 265 (or other characterization devices and/or sensors) may be utilized to monitor the temperature at one or more locations within susceptor 215. The top thermal shields 250 and/or the bottom thermal shields 255 may include or consist of one or more refractory materials (e.g., tungsten), and are preferably quite thin (e.g., between approximately 0.125 mm and 0.5 mm thick).

As mentioned above, the maximum mass transfer from source material 230 and/or vapor 225 (and therefore growth rate of semiconductor crystal 220) is typically achieved by maximizing the axial thermal gradient within the crucible 205 (i.e., maximizing the temperature difference between the source material 230 and the growing crystal 220 so that the growing crystal 220 has greater supersaturation). In preferred embodiments, the onset of crystal-quality deterioration (e.g., increased dislocation density, formation of grain boundaries, and/or polycrystalline growth) sets the approximate upper limit of the supersaturation at a given growth temperature. For typical growth temperatures (e.g., between approximately 2125° C. and approximately 2275° C.), this upper limit of the axial temperature gradient is generally approximately 100° C./cm (although this maximum may depend at least in part on the dimensions and/or shape of the growth chamber, and may thus be larger for some systems). However, as the cross-sectional area of the semiconductor crystal 220 increases (and/or for larger-area seed crystals 235), the probability of parasitic nucleation (on the seed crystal 235 or in other locations) increases. Each parasitic nucleation event may lead to formation of an additional growth center and result in grain or sub-grain formation (and thus low-quality and/or polycrystalline material). Minimizing the probability of parasitic nucleation is preferably achieved by providing a non-zero radial thermal gradient in a direction substantially perpendicular to the growth direction 245 that promotes lateral growth. Formation of the radial thermal gradient also enables growth of larger, high-quality crystals at high growth rates, as previously mentioned.

In accordance with various embodiments of the invention, the top thermal shields 250 are also arranged to form the non-zero radial thermal gradient within crucible 205. The radial thermal gradient is preferably larger than 4° C./cm, e.g., ranging between 4° C./cm and 85° C./cm (although, as described above relative to the axial thermal gradient, these values may depend on the specific dimensions and/or shape of the crucible). In preferred embodiments, the axial and radial temperature gradients are balanced. The radial and axial thermal gradients are balanced when the magnitudes of the gradients are within their upper limits (as detailed below). Preferably, the ratio between the axial and radial gradients (the thermal gradient ratio) is less than 10, less than 5.5, or even less than 3 at any given point inside the crucible 205. The thermal gradient ratio is also preferably greater than 1.2, e.g., ranging from 1.2 to 5.5. The maximum (i.e., upper limit) radial temperature gradient is a function of the growth temperature and is preferably defined by the onset of cracking and/or increased dislocation density (and/or grain-boundary formation) in semiconductor crystal 220. At the growth temperature, dislocation arrays, or even grain boundaries, may form at elevated radial thermal gradients. Such defects usually exhibit center-symmetric patterns. The minimum (i.e., lower limit) of the radial thermal gradient is preferably set by complete lack of lateral growth of the semiconductor crystal 220 perpendicular to the growth direction 245.

As noted above, after the semiconductor crystal 220 has laterally expanded to the inner dimension of the crucible 205 the expansion generally ceases. However, preferred embodiments of the invention maintain a non-zero radial thermal gradient (which may be different from the radial thermal gradient during the expansion of the semiconductor crystal 220) even after the lateral expansion of semiconductor crystal 200 has ceased in order to maintain high crystalline quality. The non-zero positive (as defined herein) radial thermal gradient generally results in semiconductor crystal 220 having a convex surface during growth (e.g., as shown in FIG. 2). Lateral growth of semiconductor crystal 220 promotes growth-center coalescence, and preferably growth initiates and proceeds from only one growth center. Even in such a case, there is preferably some non-zero magnitude of the radial gradient to prevent formation of additional growth centers. Examples of balanced axial and radial thermal gradients for growth of semiconductor crystal having a diameter of approximately two inches are set forth in the table below.

| Growth temperature (° C.) | Thermal gradient upper limit (° C./cm) | | Axial/Radial ratio |
| --- | --- | --- | --- |
| | Axial | Radial | |
| 1800 | 25 | 12 | 2.1 |
| 2250 | 105 | 45 | 2.3 |

In preferred embodiments, the crucible 205 has a lid 270 with sufficient radiation transparency to enable at least partial control of the thermal profile within the crucible 205 via the arrangement of the top thermal shields 250. Furthermore, in embodiments featuring a seed crystal 235, the seed crystal 235 is typically mounted on the lid 270 prior to the growth of semiconductor crystal 220. The lid 270 is typically mechanically stable at the growth temperature (e.g., up to approximately 2300° C.) and preferably substantially prevents diffusion of Al-containing vapor therethrough. Lid 270 generally includes or consists essentially of one or more refractory materials (e.g., tungsten, rhenium, and/or tantalum nitride), and is preferably fairly thin (e.g., less than approximately 0.5 mm thick).

The arrangement of the top thermal shields 250 provides control of the radial thermal profile, and hence provide the radial gradient preferred to maintain high crystal quality at high growth rates and to form and maintain the desired thermal gradient ratio. Simultaneously, the shield arrangements provide the necessary heat transfer to ensure the maximum growth rate. The balance between the axial and radial thermal gradients may be achieved by providing certain opening arrangements of the shields. As shown in FIG. 2, each of the top thermal shields typically has an opening 275 therethrough. The opening 275 normally echoes the geometry and/or symmetry of the crucible 205 (e.g., the opening 275 may be substantially circular for a cylindrical crucible 205). The size of each opening 275 may be varied; typically, the size(s) range from a minimum of 10 mm to a maximum of approximately 5 mm (or even 2 mm) less than the diameter of the crucible 205.

For example, in a preferred embodiment, five thermal shields 250, each having a diameter of 68.5 mm and an opening size (diameter) of 45 mm, are used. The thickness of each of the thermal shields 250 is 0.125 mm, and the thermal shields 250 are spaced approximately 7 mm from each other. At a typical growth temperature of 2065° C., this shield arrangement results in a radial thermal gradient (measured from the center of the semiconductor crystal to the inner edge of the crucible) of 27° C./cm.

As shown in FIG. 2, the top thermal shields 250 may have openings 275 larger than any such opening present in the bottom thermal shields 255, and/or the top thermal shields 250 may be stacked with one or more spacings between shields that are larger than that between the various bottom thermal shields 255. The spacings may range between approximately 1 mm and approximately 20 mm, and preferably between approximately 7 mm and approximately 20 mm. Also as shown, the openings 275 in the top thermal shields 250 may all be substantially equal to each other. Depending upon the desired growth conditions (e.g., pressure, temperature, crucible dimensions, distance between the seed crystal and the source material, etc.), the number of top thermal shields 250, the spacing between shields 250, and/or the size of the openings 275 may be varied to form the desired radial thermal gradient and hence, the desired thermal gradient ratio. The radial thermal gradient may even be varied in real time during the growth of semiconductor crystal 220, e.g., in response to feedback based on determination of the radial thermal gradient during growth. For example, the radial thermal gradient may be determined based on the temperatures of lid 270 and one or more sides of crucible 215 (e.g., measured by pyrometers 265 as shown in FIG. 2).

Similarly, although each of the top thermal shields 250 preferably has a thickness less than 0.5 mm, the thickness of one or more of the shields 250 may be varied with respect to the others. For example, one or more top thermal shields 250 may have a thickness of approximately 0.25 mm while one or more others have a thickness of approximately 0.125 mm. The thickness of the top thermal shields 250 may even be varied as a function of distance away from the lid 270 (i.e., either increasing or decreasing). Such thermal shields 250 having different thicknesses may be utilized to adjust the thermal field above and within the crucible 215. For example, a thicker shield may be used to block more radiative heat flow but will typically have higher thermal impact at temperatures where the heat flux is dominated by the thermal conductivity (lower temperatures, e.g. <1500°-1800°). Therefore, the resultant radial thermal gradient may vary as a function of growth temperature, even with the same arrangement of the same top thermal shields 250.

Figure 3A:
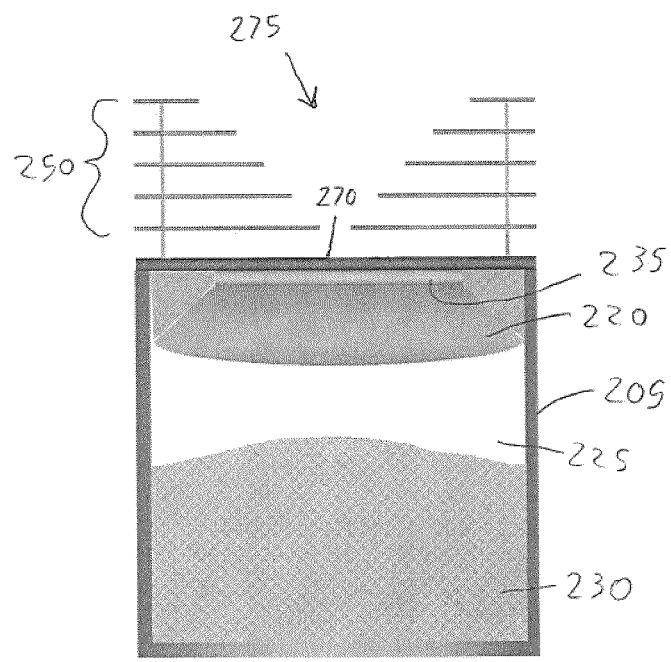
FIGS. 3A and 3B are schematic cross-sections of portions of the crystal-growth apparatus of FIG. 2 with alternate arrangements of top thermal shields, in accordance with various embodiments of the invention.
Figure 3B:
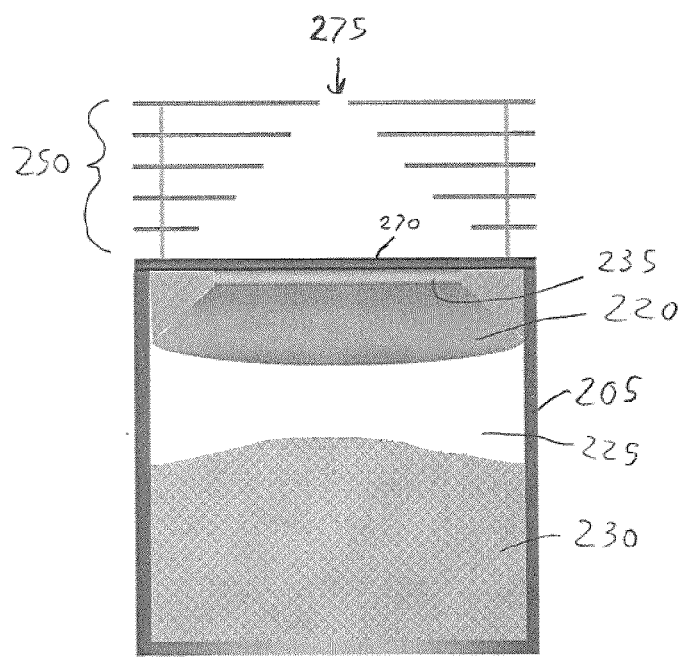

FIGS. 3A and 3B depict alternative arrangements of the top thermal shields 250 for producing a radial thermal gradient within crucible 205. Specifically, the openings 275 in the top thermal shields 250 can be varied as a function of distance away from the lid 270. As shown in FIG. 3A, the top thermal shields 250 may be arranged such that their openings 275 increase in size with increasing distance from lid 270. FIG. 3B depicts an alternate arrangement in which the top thermal shields are arranged such that their openings 275 decrease in size with increasing distance from lid 270. Of course, either of the arrangements of FIGS. 3A and 3B may be combined with any of the other arrangement variations described previously. In some embodiments, the arrangement of FIG. 3A is preferred, as it increases the probability of forming and maintaining a single growth center (where the narrowest opening is located) at the initial stages of growth.

Having described the principles and apparatus of various embodiments of the present invention, the method of operation, i.e., a growth process for AlN using the system described above is now described in conjunction with FIG. 4. As listed therein, in some embodiments, crystal growth initially involves evacuating the susceptor 215 (step 400), e.g., to pressures on the order of about 0.01 mbar (1 Pa) using a vacuum pump. The susceptor 215 is then refilled with an inert gas or a gas including or consisting essentially of nitrogen (step 405). These steps are preferably repeated one or more times to minimize oxygen and moisture contamination (step 410). Steps 400-410 may be performed by evacuating and refilling a process chamber (not shown in FIG. 2) that houses the susceptor 215 and various other portions of apparatus 200, and references to the "chamber" below may refer to such a chamber or to the susceptor 215. The chamber is then pressurized to about 1 bar (100 kPa) with nitrogen gas which is preferably mixed with a small amount of hydrogen (step 415). For example, a gas including or consisting essentially of about 95-100% $N_2$ and 0-5% $H_2$ is suitable in many embodiments. In particular embodiments, a commercially-available mixture of about 3% $H_2$ and 97% $N_2$ is employed. Polycrystalline AlN source material 230 is placed at a proximal end of the crucible 230 (step 420). The crucible 230 may then be evacuated and sealed, or may be provided with selective openings as described hereinabove. The crucible 230 is then disposed concentrically within the susceptor 215 with its distal end opposite the source material 230 (at which a seed crystal 235 may be disposed) in the high-temperature region of the heating zone produced by the heating apparatus (e.g., a furnace (step 425). The temperature is then increased to bring the distal end of the crucible 205 to a temperature of approximately 1800° C., in particular embodiments, within about 15 minutes (step 430). At the end of this temperature ramp, the gas pressure is set and maintained at a predetermined superatmospheric pressure (step 435), and the temperature is ramped to a final crystal-growth temperature (step 440), e.g., in about 5 hours. As mentioned above, the final crystal-growth temperature may range between approximately 1800° C. and approximately 2300° C. During the temperature ramp, the pressure may be continuously adjusted, e.g., using a vent valve (not shown) to maintain it at that fixed super-atmospheric value (step 445). One potential advantage of this ramping is the enhancement of the purity of the source material 230 by permitting part of any oxygen still contained within it to diffuse out of the crucible 205 (e.g., through the crucible walls). This diffusion occurs because the vapor pressure of the aluminum suboxides (such as $Al_2O$, AlO, etc.) generated due to the presence of oxygen in the source material 230, is known to be higher than that of Al over AlN for the same temperature.

Once the growth temperature is reached, the drive mechanism 260 is actuated to move the distal end of crucible 205 towards the distal end of the chamber, and relative to the axial thermal gradient produced at least in part by the heating apparatus and the arrangement of the top and bottom thermal shields (step 450). Preferably, the distal end of crucible 205 is initially located within the highest-temperature region of the susceptor 215 at the beginning of the growth run. As the crucible 205 moves upwards the distal end of crucible 205 becomes cooler than the source material 230, which promotes effective mass transport from the source material 230 to the colder region of the crucible 205.

During the growth process, the pressure is preferably maintained at a constant predetermined value (step 455). The most appropriate value for this pressure typically depends on the axial spacing between the source material 230 and the (closest) surface of the growing crystal 220, as well as the rate of nitrogen diffusion through the crucible walls or flow through other openings. It may also be appropriate to actively adjust the gas pressure over a relatively narrow range during crystal growth to compensate for any changes in the spacing between the surface of the sublimating source material 230 and the growing crystal surface.

In particular embodiments, a pressure of about 18 psi has been used to demonstrate growth rates of 0.9 mm/hr with a separation between the source material 230 and the surface of the crystal 220 of approximately 2 cm, employing tungsten crucibles fabricated by either chemical vapor deposition or powder metallurgy technique (such as those described in commonly assigned U.S. Pat. No. 6,719,843, the entirety of which is incorporated by reference herein). The source-to-growing-crystal-surface distance may vary during the growth run if the area of the growing crystal surface is different from the surface area of the source material 230 and the growth rate (i.e., axial rate of movement of the crucible through the temperature gradient) may be adjusted to account for any such change. However, typically the surface area of the source material 230 and growing crystal surface will be kept nominally constant and approximately the same size so that the separation between the source and growing crystal surface will remain substantially constant during most of the growth.

Finally, the movement of crucible 205 is stopped (step 460) and a cooling ramp (step 465) is established to bring the apparatus and the crystal 220 to room temperature. Using pressures in the range 100 kPa to 150 kPa (1 atm to 1.5 atm), single-crystal boules have been grown at an axial pushing rate ranging between about 0.4 and 0.9 mm/h, for example, at the rate of 0.455 mm/h. By adjusting the distance between the source material and the growing crystal surface, and by adjusting the axial and radial temperature gradients, other useful growth conditions may be obtained. Hence, skilled practitioners may usefully use various embodiments of the present invention with total chamber pressures from 50 kPa to 1 MPa (0.5 atm to 10 atm) and axial pushing/growth rates of 0.3 to about 3 mm/h, or even higher.

By slicing or cutting the bulk single crystals of embodiments of the present invention, crystalline substrates, e.g., of AlN, of desired thickness—for example, about 500 μm or 350 μm—may be produced. These substrates may then be prepared, typically by polishing, for high-quality epitaxial growth of appropriate layers of AlN, GaN, InN and/or their binary and tertiary alloys to form electronic and optoelectronic devices such as UV laser diodes and high-efficiency UV LEDs. The aforementioned nitride layers may be described by the chemical formula $Al_xGa_yIn_{1-x-y}N$, where $0 \leq x \leq 1$ and $0 \leq y \leq 1-x$.

In various embodiments, the surface preparation of crystals including or consisting essentially of AlN enables high-quality epitaxial growth of nitride layers on the AlN substrate. Surface damage is preferably carefully removed in order to obtain high-quality epitaxial layers needed for fabrication of high performance nitride semiconductor devices. One successful approach to remove surface damage from the AlN substrate is to employ a chemical-mechanical polishing (CMP) approach, e.g. as described in U.S. Pat. No. 7,037,838 (the '838 patent), incorporated herein by reference in its entirety. Through this approach, very high-quality epitaxial layers of $Al_xGa_yIn_{1-x-y}N$ with low dislocation densities may be produced using organometallic vapor phase epitaxy (OMVPE), particularly when x exceeds 0.5. Those skilled in the art will recognize that other epitaxial growth techniques such as molecular beam epitaxy (MBE) or hydride vapor phase epitaxy (HVPE) may also be successfully employed to produce high-quality epitaxial layers on the high-quality semiconductor crystals produced in accordance with embodiments of the present invention.

The growth of bulk single crystals has been described herein primarily as being implemented by what is commonly referred to as a "sublimation" or "sublimation-recondensation" technique wherein the source vapor is produced at least in part when, for production of AlN, crystalline solids of AlN or other solids or liquids containing AlN, Al or N sublime preferentially. However, the source vapor may be achieved in whole or in part by the injection of source gases or like techniques that some would refer to as "high-temperature CVD." Also, other terms are sometimes used to describe these and other techniques that are used to grow bulk single AlN crystals according to this invention. Therefore, the terms "depositing," "depositing vapor species," and like terms will sometimes be used herein to generally cover those techniques by which the crystal may be grown pursuant to embodiments of this invention.

Thus, the single-crystal semiconductors fabricated using the embodiments described hereinabove may be used to produce substrates by cutting a wafer or cylinder from the bulk single-crystal, preparing a surface on the wafer or cylinder in a known manner to be receptive to an epitaxial layer, and depositing an epitaxial layer on the surface using conventional deposition techniques.

In particular embodiments of the invention, large, e.g. greater than about 25 mm in diameter, single-crystal AlN wafers are produced from single-crystal AlN boules having a diameter exceeding the diameter of the final substrate, e.g., boules having a diameter greater than about 30 mm. Using this approach, after growing the boule and orienting it, e.g. by employing x-ray Laue diffraction technique, to obtain a desirable crystallographic orientation for the wafer, the boule is mechanically ground down to a cylinder having a desirable diameter and then sliced into individual wafers, e.g., using a wire saw. In some versions of these embodiments, the boules are grown by, first, producing high-quality single-crystal seeds, and then using the seed crystals as nuclei to grow larger diameter single-crystal boules through a crystal-expansion growth run. Large-diameter slices from this second crystal growth process may then be utilized to grow large-diameter crystals without diameter expansion. In alternative versions, the crystal growth is self-seeded, i.e. the crystal is grown without employing single-crystal seeds.

In various embodiments, high-purity source material 230 including or consisting essentially of AlN may be produced in a crucible 205 (or other suitable container) by reacting high-purity Al (e.g. having 99.999% purity, available from Alpha Aesar of Ward Hill, Mass., USA) with high-purity $N_2$ gas (e.g. having 99.999% purity, available from Awesco of Albany, N.Y., USA). In a particular embodiment, pieces of high-purity AlN ceramic, e.g. weighing about 9 g or less, are placed in a bottom portion of the crucible and heated to about 2300° C. in a forming gas atmosphere in order to sublime the AlN and recondense it. As a result, the density of the resulting ceramic may be increased to approximately theoretical density by sublimation transport to decrease the surface area relative to the volume of the source material. The resulting AlN ceramic source material 230 may have impurity concentration of less than about 500 ppm.

In growth processes in accordance with various embodiments of the invention, the crucible 205 loaded with the source material 230 may be assembled and/or disposed in the heating apparatus, e.g. high-pressure crystal growth furnace available from Arthur D. Little, Inc. Specifically, the crucible 205 may be placed on crucible stand 210 within the susceptor 215. Both top thermal shields 250 and bottom thermal shields 255 may then be installed around the crucible 205 with the susceptor 215 around the crucible 205 and thermal shields. The crucible 205 is preferably positioned such that the lid 270 and/or seed crystal 235 is either below or above the location of the large axial thermal gradient formed by the thermal shields. In the first case (i.e. below the large axial gradient) the seed crystal 235 is initially maintained at a higher temperature than the source material 230 so that little or no nucleation occurs during a warm-up. If the seed crystal 235 is above the large axial gradient the initial nucleation is generally controlled by modification of the temperature ramp-up profile.

The growth chamber is then closed and evacuated, as described above, to reduce trace atmosphere contamination of the nucleation process and the resulting single crystal. In various embodiments, following evacuation, e.g., to less than about 1 Pa employing a mechanical Welch pump with minimum pressure of about ~0.5 Pa, the chamber is filled with a forming gas blend of 3% $H_2$ and 97% $N_2$ to a pressure of about 100 kPa and then evacuated again to less than 10 mTorr. This refill and pump process may be carried out three times or more to reduce chamber contamination. Following the pump and refill processes, the chamber is filled with the forming gas to a pressure of, e.g., 117 kPa. High-purity grade gas, e.g., available from GTS-WELCO (99.999% certified), may be used to further ensure a clean growth chamber atmosphere.

During a ramp to the growth temperature, the pressure in the chamber increases until the target growth pressure of, e.g., 124 kPa is reached. After reaching the operating pressure, the chamber pressure may be periodically checked and incrementally adjusted by releasing gas from the chamber to a vent line in order to keep the chamber pressure between, e.g., 124 kPa and 125 kPa.

In some embodiments, the power supply for operating the growth apparatus 200 is an RF oscillator with a maximum power output of 75 kW at 10 kHz. The growth temperature inside the heating apparatus may be increased in two ramp segments. For example, the first segment of the ramp may be linear for about 1.5 hours taking the top axial optical pyrometer temperature to about 1800° C. The second ramp segment may then be linear for approximately 3.5 hours taking the top axial temperature to about 2050° C. The chamber may then be maintained at growth temperature and pressure for a period of about 1 hour. Then, the crucible 205 may be moved up by the drive apparatus at a rate of, for example, approximately 0.5 mm/hr. During the growth run, this push rate is held constant, such that the total travel is about 30 mm, producing a single-crystal AlN boule that reached about 35 mm in length and about 50 mm in diameter. Shorter or longer crystals may be produced by varying the travel distance (which is directly related to the push time). The cool-down from growth temperature can be done linearly for the period of time between approximately 1 and approximately 24 hours. Once the apparatus is at room temperature, the chamber may be pumped to less than 1 Pa and backfilled to atmospheric pressure with the forming gas, allowing the chamber to be opened and the growth crucible assembly removed from the heating apparatus for evaluation. The growth chamber may then be closed and evacuated as described above to reduce trace atmosphere contamination of the growth cell, nucleation process and resulting AlN single crystal.

In particular embodiments, following pump-down to less than 7 mPa, e.g., using a turbo pump with a minimum pressure of about 0.4 mPa, the chamber is filled with a forming gas blend of 3% $H_2$ and 97% $N_2$ to a pressure of about 122 kPa. Following the pump and refill process, the chamber is filled with the forming gas for the start of the growth process to a pressure of 117 kPa. As described above, a high-purity grade gas available from GTS-WELCO (99.999% certified) may be used to further ensure a clean growth chamber atmosphere.

During a ramp to the growth temperature, the pressure in the chamber increases until the target growth pressure is reached. After reaching the operating pressure, the chamber pressure may be periodically checked and incrementally adjusted by releasing gas from the chamber to a vent line in order to keep the chamber pressure between, e.g., 124 kPa and 125 kPa.

The growth temperature inside the heating apparatus and crucible may be increased in two segments. For example, in the first segment, the temperature is linearly increased from the room temperature to about 1800° C. in 1.5 hours. Then, the second ramp segment to the final growth temperature determined by the optical pyrometer, e.g. for 3.5 hours, may be initiated after operator inspection.

The chamber is then maintained at the growth temperature and pressure for a period of, for example, 1 hour. The drive apparatus 260 then pushes the crucible 205 up at a rate ranging from about 0.2 to 1.0 mm/hr, for example, at approximately 0.5 mm/hr. In a particular version, during the growth run, this push rate is held constant and the total travel is about 30 mm, producing a single crystal AlN boule that reached about 50 mm in diameter and 35 mm in length. Shorter or longer crystals may be produced by varying the distance the crucible 205 is pushed or equivalently by varying the push time.

Following completion of the vertical travel, the vertical motion of the crucible 205 is stopped and the pressure is increased to 157 kPa by adding more high-purity forming gas. The power to the heating apparatus is then linearly reduced to zero, for example, in 6 hours and the system is allowed to cool to room temperature. Following the cool down, the chamber is pumped to, e.g., less than about 1 mPa and backfilled to atmospheric pressure with forming gas. The chamber is then opened and the growth crucible 205 removed for evaluation.

In various embodiments, after orienting the resulting single-crystal boule, e.g., by employing the x-ray Laue diffraction technique, the boule is encased in epoxy, e.g. VAL-TRON available from Valtech, and then ground down to a 25-mm diameter cylinder having its longitudinal axis oriented along the desired crystallographic direction. Once the oriented cylinder is produced, it is once again examined by the x-ray Laue diffraction technique to determine precise orientation (within +/−0.2°) and then sliced with a wire saw, e.g. the Model DT480 saw, for example, the one available from Diamond Wire Technologies, into a wafer. Those skilled in the art of semiconductor wafer preparation will readily recognize that there are many alternatives for slicing the crystal using diamond-coated ID and OD saws. The surface of the wafer is then prepared for epitaxial growth utilizing, for example, one or more techniques described in the '838 patent.

Seeded Growth Using Polished Semiconductor Wafers

In some embodiments, a piece of semiconductor material (e.g., including or consisting essentially of AlN) having a known crystallographic orientation is used as a seed from which bulk material may then be grown. In a particular embodiment, a polished AlN wafer sliced from a bulk crystal is employed as a seed, offering a number of benefits, including standardization and improved control over the growth direction.

In order to grow high-quality crystals, very high temperatures, for example exceeding 2100° C., are generally desirable. At the same time, as discussed above, high axial thermal gradients are needed to provide sufficient mass transport from the source material to the seed crystal. Additionally, non-zero radial thermal gradients, resulting in thermal gradient ratios less than 10 as detailed above, are preferably utilized to enable growth of larger crystals at faster rates while maintaining high crystalline quality. However, if not chosen properly, these growth conditions may result in evaporation of seed material or its total destruction and loss.

Preferably, the mounting technique employed in these embodiments to secure AlN seeds entails:

(1) employing a seed holder and/or adhesive compound that is sufficiently strong to secure the seed and the crystal being grown;

(2) protecting the opposite side of the seed during growth to avoid re-evaporation of the AlN, as this may result in formation of planar and/or extended void defects; and (3) avoiding contamination of the crystal and the crucible by the material chosen to protect the opposite side of the seed or as the adhesive.

In some embodiments, AlN seeded bulk-crystal growth is carried out in the crucible 205 using a high-purity AlN source 230. In some embodiments, the apparatus 200 for growth of single-crystal AlN boules includes a crucible 205 such as the one disclosed in U.S. Pat. No. 6,719,842 (the '842 patent), incorporated herein by reference in its entirety, consisting essentially of tungsten and fabricated by a CVD process. Multiple grain layers within the wall of the crucible may be obtained by interrupting the tungsten deposition several times before the final wall thickness is obtained. Other crucible materials may be used, such as tungsten-rhenium (W—Re) alloys; rhenium (Re); tantalum monocarbide (TaC); a mixture of $Ta_2C$ and TaC; a mixture of $Ta_2C$, TaC and Ta; tantalum nitride ($Ta_2N$); a mixture of Ta and $Ta_2N$; hafnium nitride (HfN); a mixture of Hf and HfN; a mixture of tungsten and tantalum (W—Ta); tungsten (W); and combinations thereof. The apparatus preferably houses an AlN source material 230, for example, consisting essentially of high-purity AlN polycrystalline ceramic.

The tungsten crucible is placed into an inductively heated furnace, as described above, so that the temperature gradient between the source 230 and the seed crystal 235 drives vapor 225 to move from the hotter high purity AlN ceramic source to the cooler seed crystal. The temperature at the seed interface and the temperature gradients are monitored and carefully adjusted, if necessary, in order to nucleate high-quality mono-crystalline material on the seed and not destroy the AlN seed. Skilled artisans will also readily recognize that while various embodiments of the present invention have been described herein as utilizing a seed crystal to promote crystal growth, the teachings herein may also be used for unseeded crystal growth, without departing from the scope and spirit of the present invention.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of forming single-crystal aluminum nitride (AlN), the method comprising:
   providing a plurality of thermal shields comprising (i) a first thermal shield defining a first opening therethrough and (ii) a second thermal shield defining a second opening therethrough larger than the first opening;
   arranging the plurality of thermal shields over the lid of a growth chamber such that the first thermal shield is disposed between the lid of the growth chamber and the second thermal shield;
   initiating the formation of an AlN single crystal substantially at a single growth center within the growth chamber proximate the lid of the growth chamber, a location of the single growth center being determined at least in part by a location of the first opening in the arranged first thermal shield;
   condensing vapor comprising aluminum and nitrogen within the growth chamber, thereby increasing a size of the AlN single crystal along a growth direction; and
   during formation of the AlN single crystal, forming and maintaining, within the growth chamber and at least in part via arrangement of the plurality of thermal shields outside of the growth chamber, (i) a first non-zero thermal gradient in a direction substantially parallel to the growth direction and (ii) a second non-zero thermal gradient in a direction substantially perpendicular to the growth direction,
   wherein a ratio of the first thermal gradient to the second thermal gradient is less than 10.

2. The method of claim 1, further comprising subliming solid source material within the growth chamber to form the vapor.

3. The method of claim 2, wherein the solid source material comprises polycrystalline AlN.

4. The method of claim 1, wherein the second thermal gradient is larger than 4° C./cm.

5. The method of claim 1, wherein the second thermal gradient is smaller than 85° C./cm.

6. The method of claim 1, wherein the ratio of the first thermal gradient to the second thermal gradient is greater than 1.2.

7. The method of claim 1, wherein the first thermal gradient is larger than 5° C./cm.

8. The method of claim 1, wherein the first thermal gradient is smaller than 100° C./cm.

9. The method of claim 1, wherein the ratio of the first thermal gradient to the second thermal gradient is less than 5.5.

10. The method of claim 1, wherein the ratio of the first thermal gradient to the second thermal gradient is less than 3.

11. The method of claim 1, wherein each of the thermal shields comprises a refractory material.

12. The method of claim 1, wherein each of the thermal shields comprises tungsten.

13. The method of claim 1, wherein the first opening and the second opening each ranges from approximately 10 mm to approximately 2 mm less than a dimension of the growth chamber substantially perpendicular to the growth direction.

14. The method of claim 1, wherein at least two of the thermal shields have different thicknesses.

15. The method of claim 1, wherein a thickness of each of the thermal shields ranges from approximately 0.125 mm to approximately 0.5 mm.

16. The method of claim 1, wherein a thickness of the lid is less than approximately 0.5 mm.

17. The method of claim 1, wherein the lid comprises tungsten.

18. The method of claim 1, further comprising disposing a seed within the growth chamber before forming the AlN single crystal, the AlN single crystal forming on the seed and extending therefrom in the growth direction.

19. The method of claim 18, wherein a diameter of the seed is greater than approximately 25 mm.

20. The method of claim 1, wherein a growth rate of the AlN single crystal is greater than approximately 0.5 mm/hr.

21. The method of claim 1, wherein the AN single crystal forms on a seed disposed within the growth chamber.

22. The method of claim 1, wherein the lid of the growth chamber (i) is approximately planar, (ii) extends approximately perpendicular to the growth direction, and (iii) has an area larger than an area of the single growth center.

23. The method of claim 18, wherein an area of the first opening is smaller than a surface area of the seed.

24. The method of claim 21, wherein an area of the first opening is smaller than a surface area of the seed.

* * * * *